United States Patent
Marukame et al.

(10) Patent No.: US 11,380,375 B2
(45) Date of Patent: Jul. 5, 2022

(54) STORAGE DEVICE AND NEURAL NETWORK APPARATUS

(71) Applicant: KABUSHIKI KAISHA TOSHIBA, Tokyo (JP)

(72) Inventors: Takao Marukame, Chuo Tokyo (JP); Koichi Mizushima, Kamakura Kanagawa (JP); Kumiko Nomura, Shinagawa Tokyo (JP); Yoshifumi Nishi, Yokohama Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 17/185,769

(22) Filed: Feb. 25, 2021

(65) Prior Publication Data

US 2022/0068326 A1    Mar. 3, 2022

(30) Foreign Application Priority Data

Aug. 25, 2020    (JP) .............................. JP2020-141395

(51) Int. Cl.
*G11C 7/16* (2006.01)
*G11C 7/10* (2006.01)
(Continued)

(52) U.S. Cl.
CPC ............ *G11C 7/1036* (2013.01); *G06N 3/063* (2013.01); *G11C 7/20* (2013.01); *G11C 13/004* (2013.01); *G11C 13/0069* (2013.01)

(58) Field of Classification Search
CPC ....... G11C 7/1036; G11C 7/20; G11C 13/004; G11C 13/0069; G06N 3/063; G06N 3/0454
See application file for complete search history.

(56) References Cited

U.S. PATENT DOCUMENTS 9,779,355 B1 * 10/2017 Leobandung .......... G06N 3/084
9,842,293 B2 * 12/2017 Young ...................... G06N 5/04
(Continued)

FOREIGN PATENT DOCUMENTS

JP    2018-67154 A    4/2018
JP    2018-120433 A    8/2018
(Continued)

OTHER PUBLICATIONS

J. Park, et al. "A 65n m 236.5n JClassification Neuromorphic Processor with 7.5% Energy Overhead On-Chip Learning Using Direct Spike-Only Feedback," IEEE In tern ati onal So lid-State Circuits Conf. Digest o f Tech. Papers, pp. 140-142 (2019).
(Continued)

*Primary Examiner* — Hien N Nguyen
(74) *Attorney, Agent, or Firm* — Finnegan, Henderson, Farabow, Garrett & Dunner L.L.P.

(57) ABSTRACT

A storage device according to an embodiment is for storing weights being continuous values. The storage device includes: a shift register, an initialization circuit, an update control circuit, and a readout control circuit. The shift resistor includes a plurality of cells, each being arranged in series and storing information. A position of each of the plurality of cells corresponds to the weight. The initialization circuit writes the information to a cell in the shift register. The update control circuit shifts a position of the cell storing the information in a direction corresponding to a sign of an update amount by a number of cells corresponding to an absolute value of the update amount. The readout control circuit reads out the information and outputs an output value according to the weight corresponding to the position of the cell storing the information.

13 Claims, 18 Drawing Sheets

(51) Int. Cl.
*G11C 7/20* (2006.01)
*G06N 3/063* (2006.01)
*G11C 13/00* (2006.01)

(56) References Cited

U.S. PATENT DOCUMENTS

| | | | |
|---|---|---|---|
| 10,175,947 | B1 | 1/2019 | Marukame et al. |
| 2016/0342891 | A1* | 11/2016 | Ross ................ G06N 3/063 |
| 2018/0336164 | A1 | 2/2018 | Seo et al. |
| 2018/0211154 | A1 | 7/2018 | Mori et al. |
| 2019/0026076 | A1* | 1/2019 | Leng ................ G06N 3/063 |
| 2019/0035457 | A1 | 1/2019 | Yang et al. |
| 2019/0156180 | A1* | 5/2019 | Nomura ............. G06N 3/063 |
| 2019/0156181 | A1 | 5/2019 | Marukame et al. |
| 2019/0205780 | A1 | 7/2019 | Sakaguchi |
| 2019/0325291 | A1* | 10/2019 | Gokmen ............ G06N 3/0454 |
| 2020/0026496 | A1 | 1/2020 | Marukame et al. |
| 2020/0034695 | A1 | 1/2020 | Marukame et al. |
| 2020/0293861 | A1 | 9/2020 | Marukame et al. |
| 2020/0302274 | A1 | 9/2020 | Marukame et al. |
| 2020/0302275 | A1 | 9/2020 | Nomura et al. |
| 2020/0379733 | A1 | 12/2020 | Berdan et al. |
| 2020/0380347 | A1 | 12/2020 | Marukame et al. |

FOREIGN PATENT DOCUMENTS

| | | |
|---|---|---|
| JP | 2019-53563 A | 4/2019 |
| JP | 2019-95860 A | 6/2019 |
| JP | 2020-13398 A | 1/2020 |
| JP | 2020-17114 A | 1/2020 |
| JP | 2020-149625 A | 9/2020 |
| JP | 2020-197761 A | 12/2020 |
| JP | 2020-197922 A | 12/2020 |
| JP | 2020-205132 A | 12/2020 |

OTHER PUBLICATIONS

A. J. Agranat, et al. "The CCD Neural Processor A Neural Network Integrated Circuit with 65536 Prog rammable An alog Syn apses," IEEE Tran sactions o n Circuits, vol. 37, No. 8, pp. 1073-1075 (1990).

A.M. Chiang, et al.,"A CCD Pro g rammable Imag e Processor an d its Neural Network Applications," IEEE Journ al of Solid-State Circuits, vol. 26, No. 12, pp. 1894-1901 (1991).

C.F. Neugebaue, et al. "A Parallel An alog CCD/CMOS Neural Network IC," IEEE, pp. I-447 to I-451 (1991).

U. Ramacher et al., "VLSI Design of Neural Networks," Springer Science+Business Media, LLC, pp. 20-45 (1991).

* cited by examiner

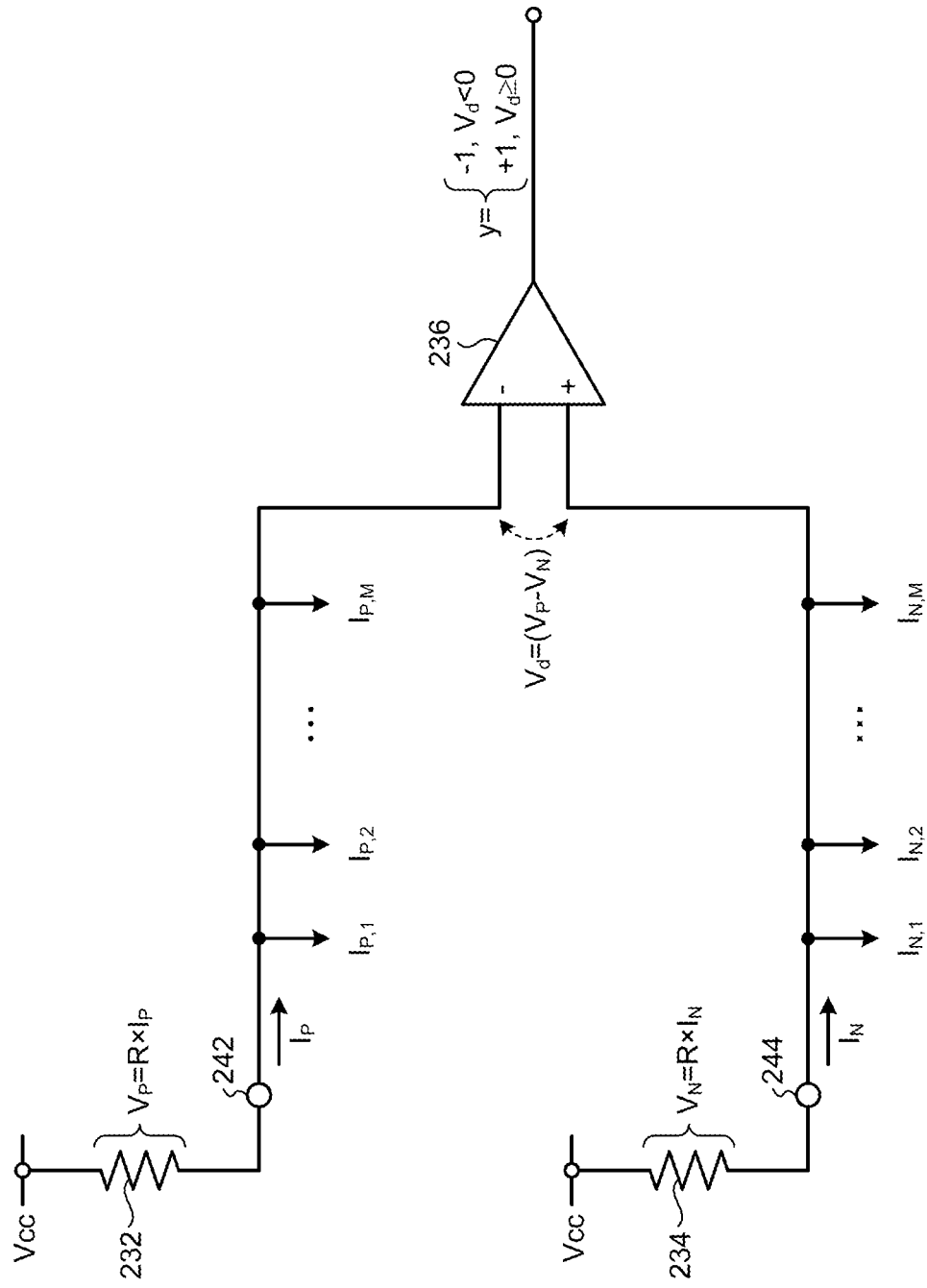

STORAGE DEVICE AND NEURAL NETWORK APPARATUS

CROSS-REFERENCE TO RELATED APPLICATIONS

This application is based upon and claims the benefit of priority from Japanese Patent Application No. 2020-141395, filed on Aug. 25, 2020; the entire contents of which are incorporated herein by reference.

FIELD

Embodiments described herein relate generally to a storage device and a neural network apparatus.

BACKGROUND

In recent years, a neural network apparatus implemented by hardware has been studied. Each of units included in such a neural network implemented by hardware executes a product-sum operation (multiply-accumulation) by an electric circuit. Each unit implemented by an electric circuit multiplies, by a weight, each of input signals received from a unit in the previous stage, and adds the input signals to which the weights have been multiplied.

By the way, in such a neural network apparatus implemented by hardware, a value in binary may be sufficient for the weight used for inference. However, even when the weight used for the inference is binary, the weight used in a learning process needs to be a continuous value (multi-value) because it needs to be updated by a minute amount. For example, it is considered that the weight at the time of learning needs to have a precision of about 1000 values, for example, about 10 bits. Furthermore, it is preferable that the neural network apparatus implemented by hardware can update the weight at high speed at the time of learning.

Accordingly, there is a need for storing weights being continuous values with high-precision and updating the stored weights at high speed.

BRIEF DESCRIPTION OF THE DRAWINGS

FIG. 21 is an illustration of operation of a comparator.

DETAILED DESCRIPTION

A storage device according to an embodiment is for storing weights being continuous values. The storage device includes a shift register, an initialization circuit, an update control circuit, and a readout control circuit. The shift register includes a plurality of cells, each being arranged in series and storing information. The shift register is capable of shifting a position of the cell storing the information among the plurality of cells in a forward direction and a reverse direction in units of cells. A position of each of the plurality of cells corresponds to the weight. The weight corresponds to each of the plurality of cells continuously increasing or decreasing together with a change in the position in the forward direction. The initialization circuit is configured to write the information to one of the plurality of cells included in the shift register. The update control circuit is configured to: receive an update amount of the weight; and shift a position of the cell storing the information in a direction corresponding to a sign of the update amount by a number of cells corresponding to an absolute value of the update amount. The readout control circuit is configured to: read out the information stored in the plurality of cells; and output an output value according to the weight corresponding to the position of the cell storing the information.

Hereinafter, a neural network apparatus 10 according to an embodiment will be described with reference to the drawings.

Figure 1:
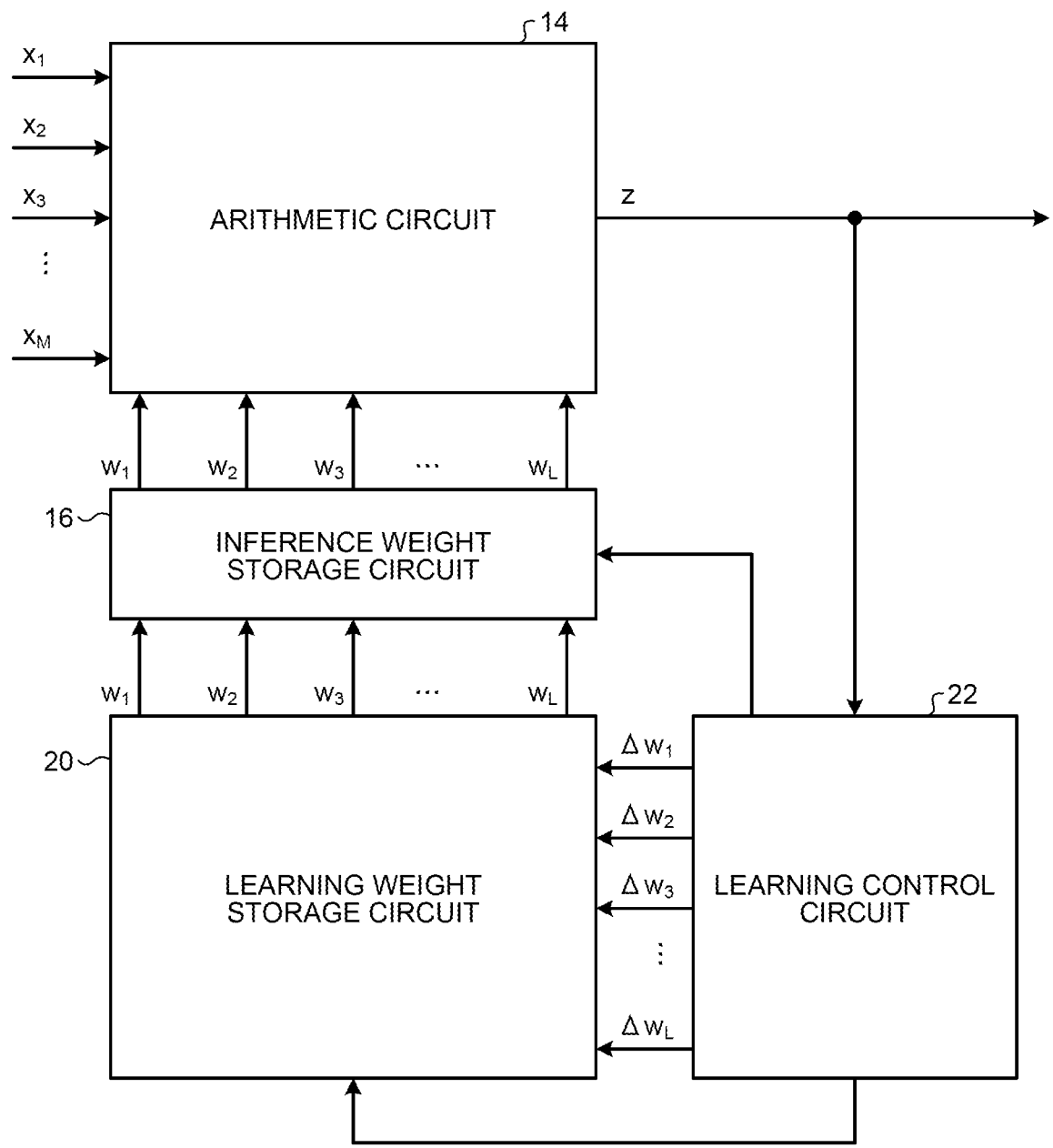
FIG. 1 is a diagram illustrating a configuration of a neural network apparatus according to an embodiment.

FIG. 1 is a diagram illustrating a configuration of the neural network apparatus 10 according to an embodiment. The neural network apparatus 10 includes an arithmetic circuit 14, an inference weight storage circuit 16, a learning weight storage circuit 20 (an example of the storage device), and a learning control circuit 22.

The arithmetic circuit 14 executes arithmetic processing according to a neural network. The arithmetic circuit 14 is implemented by an electric circuit including an analog circuit. For example, the arithmetic circuit 14 receives M input signals $(x_1, \ldots, x_M)$ (M is an integer of 2 or more) and outputs an output signal (z). The arithmetic circuit 14 may output a plurality of output signals.

The inference weight storage circuit 16 stores a plurality of inference weights used in arithmetic processing according to the neural network by the arithmetic circuit 14. The inference weight storage circuit 16 stores L inference weights ($w_1, \ldots, w_L$) (L is an integer of 2 or more), for example. Each of the plurality of inference weights is binary. This enables the arithmetic circuit 14 to execute arithmetic processing according to the neural network at high speed by the analog circuit by using a plurality of inference weights each of which represented by binary. The inference weight storage circuit 16 includes, for example, a plurality of registers each of which storing binary inference weights.

The learning weight storage circuit 20 (the storage device) stores a plurality of weights corresponding to a plurality of inference weights in the learning process of the neural network. The learning weight storage circuit 20 stores, for example, L weights ($w_1, \ldots, w_L$) that correspond one-to-one with L inference weights. Each of the plurality of weights is a continuous value (multi-value). Each of the plurality of weights stored in the learning weight storage circuit 20 is represented by a signed 10-bit precision, for example.

In the learning process of the neural network, the learning control circuit 22 causes the learning weight storage circuit 20 to store the initial values of a plurality of weights. Subsequently, the learning control circuit 22 repeats the update process a plurality of times. In the update process, the learning control circuit 22 generates an update amount ($\Delta w_1, \ldots, \Delta w_L$) corresponding to each of the plurality of weights based on the calculation result obtained by the arithmetic circuit 14, and gives the generated update amount to the learning weight storage circuit 20 so as to update each of the plurality of weights stored in the learning weight storage circuit 20. The number of times of execution of the update process by the learning control circuit 22 may be only one. After the learning process, the learning control circuit 22 controls the inference weight storage circuit 16 to store a plurality of output values corresponding to the plurality of weights stored in the learning weight storage circuit 20, as a plurality of inference weights.

In this manner, the learning control circuit 22 executes the learning process applied to the neural network by using a plurality of weights expressed in continuous values. This enables the learning control circuit 22 to increase or decrease each of the plurality of weights by a minute amount in the learning process, making it possible to apply high-precision learning to the neural network.

Figure 2:
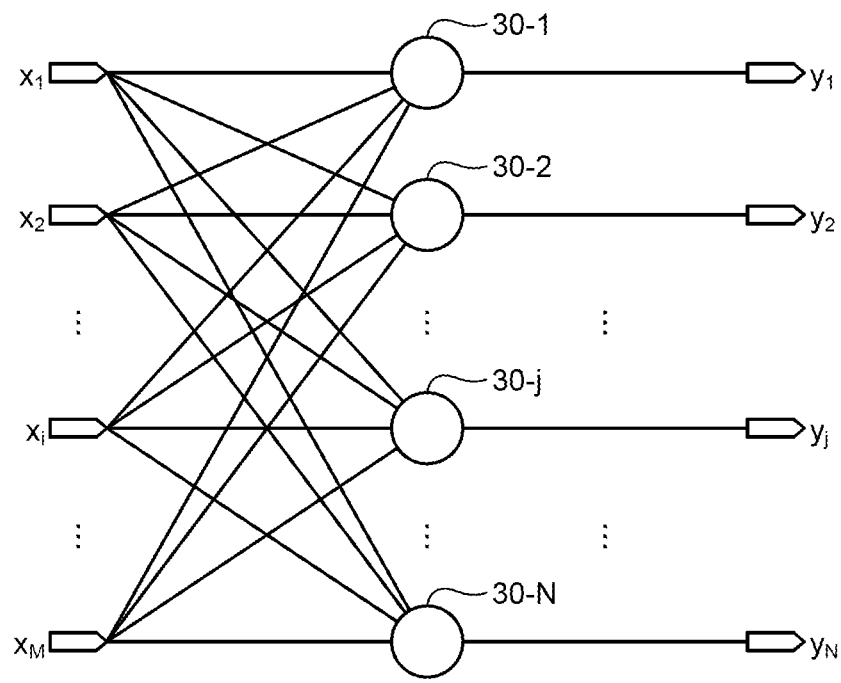
FIG. 2 is diagram illustrating one layer of a neural network.

FIG. 2 is a diagram illustrating one layer of a neural network. The neural network includes, for example, one or more layers as illustrated in FIG. 2. The arithmetic circuit 14 includes a circuit that executes an arithmetic corresponding to a layer as illustrated in FIG. 2.

In order to execute layer operations as illustrated in FIG. 2, the arithmetic circuit 14 includes N product-sum operation circuits 30 (30-1 to 30-N) corresponding to N (N is an integer of 2 or more) intermediate signals ($y_1$ to $y_N$), for example. The j-th product-sum operation circuit 30-j (j is an arbitrary integer from 1 to N) of the N product-sum operation circuits 30 corresponds to the j-th intermediate signal ($y_j$). Furthermore, each of the N product-sum operation circuits 30 receives M input signals ($x_1$ to $x_M$).

Figure 3:
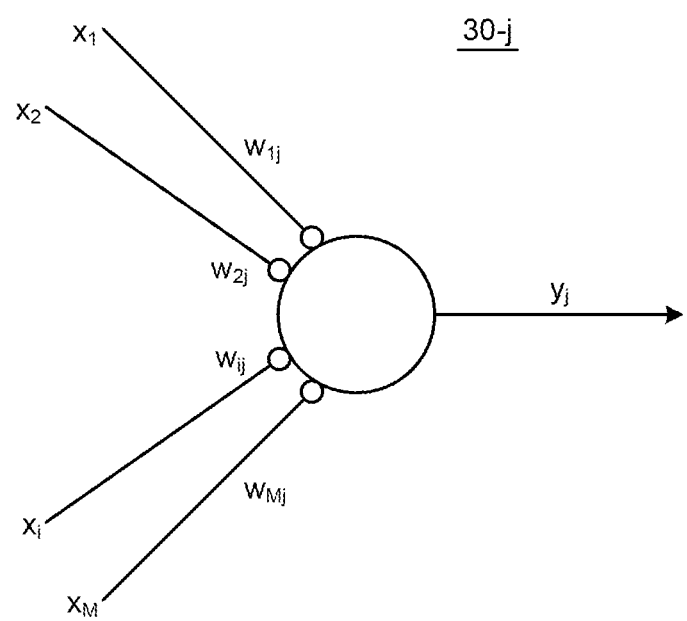
FIG. 3 is a diagram illustrating a product-sum operation performed by a product-sum operation circuit.

FIG. 3 is a diagram illustrating a product-sum operation performed by the product-sum operation circuit 30. Each of the N product-sum operation circuits 30 has M inference weights ($w_{1j}, w_{2j}, \ldots, w_{ij}, \ldots, w_{Mj}$) corresponding to M input signals from the inference weight storage circuit 16.

Each of the N product-sum operation circuits 30 outputs an intermediate signal generated by binarizing the value obtained by the product-sum operation of M input signals and M inference weights. For example, the product-sum operation circuit 30-j corresponding to the j-th intermediate signal executes the arithmetic operation of the following Formula (1) in an analog operation.

$$y_j = f\left(\sum_{i=1}^{M} x_i w_{ij}\right) \quad (1)$$

In Formula (1), $y_j$ represents the j-th intermediate signal. $x_i$ represents the i-th input signal (i is an integer that is 1 or more and M or less). $w_{ij}$ represents an inference weight to be multiplied by the i-th input signal out of the M inference weights. In Formula (1), f(X) represents a function that binarizes a value X in parentheses with a predetermined threshold.

Figure 4:
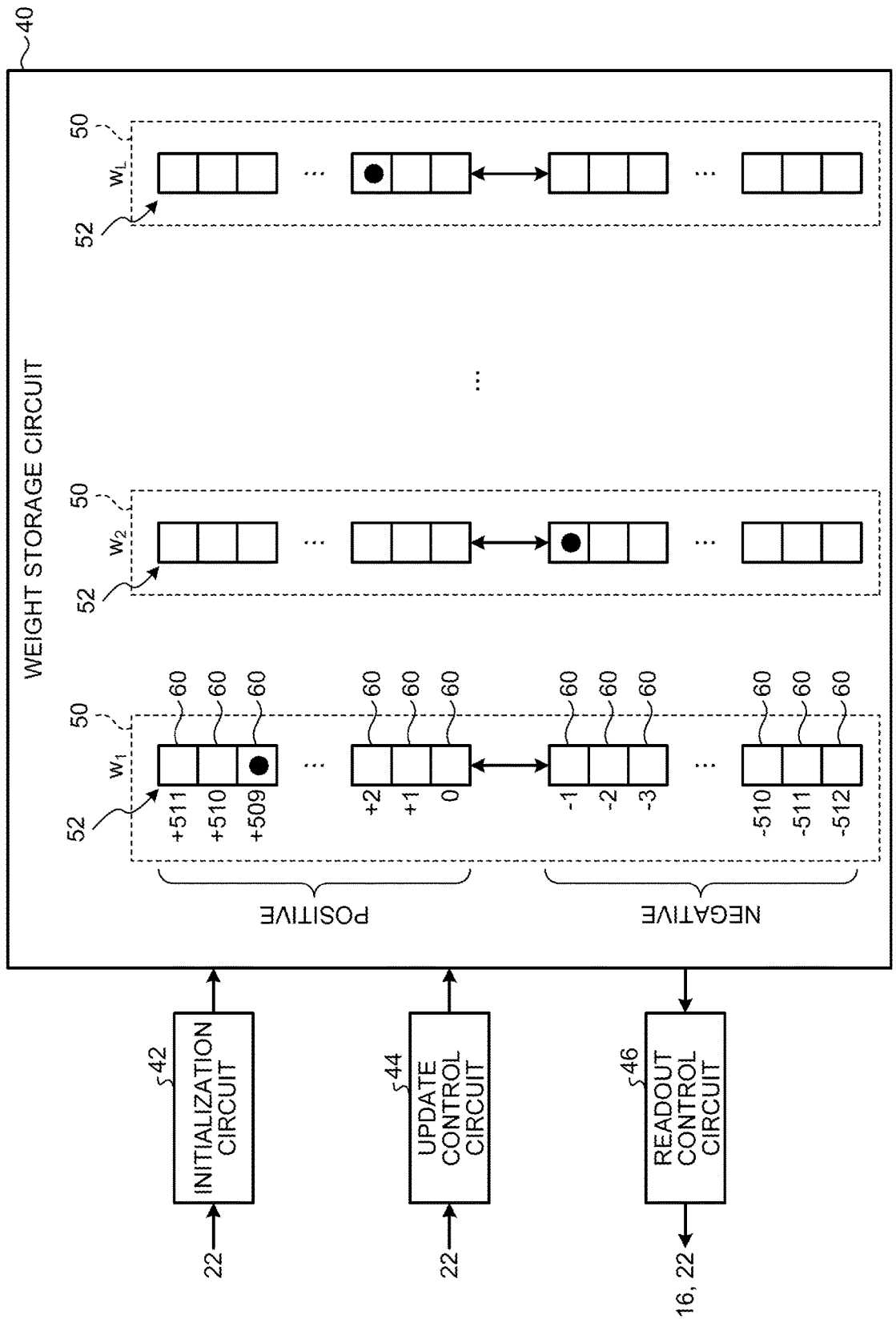
FIG. 4 is a diagram illustrating a configuration of a learning weight storage circuit.

FIG. 4 is a diagram illustrating a configuration of the learning weight storage circuit 20. The learning weight storage circuit 20 includes a weight storage circuit 40, an initialization circuit 42, an update control circuit 44, and a readout control circuit 46.

The weight storage circuit 40 includes a plurality of storage circuits 50 having a one-to-one correspondence with a plurality of weights stored by the learning weight storage circuit 20. For example, the weight storage circuit 40 includes L storage circuits 50.

Each of the plurality of storage circuits 50 stores weights that are continuous values. Each of the plurality of storage circuits 50 has a shift register 52 for storing weights that are continuous values.

The shift register 52 includes a plurality of cells 60 arranged in series. Each of the plurality of cells 60 stores information for one bit.

In response to a transfer control signal from the outside, the shift register 52 can shift the position of the cell 60 that stores information among the plurality of cells 60 in unit of one cell in the forward direction and the reverse direction. Here, the forward direction refers to one of the arrangement directions of the plurality of cells 60. The reverse direction refers to a direction opposite to the forward direction between the arrangement directions of the plurality of cells 60.

The position in the arrangement direction in each of the plurality of cells 60 corresponds to the weight. The weight corresponding to each of the plurality of cells 60 continuously increases or decreases in accordance with the position change in the forward direction.

For example, when the weights are represented with a signed 10-bit precision, the shift register 52 contains 1024 cells 60. In this case, for example, the cell 60 at one end of the 1024 cells 60 corresponds to a weight of "−512". Furthermore, the cell 60 at the other end corresponds to a weight of "+511". The direction from the cell 60 corresponding to "−512" to the cell 60 corresponding to "+511" is defined as the forward direction. The weight corresponding to each of the plurality of cells 60 increases by "+1" together with the change of the position of the cell 60 by one shift in the forward direction. In this example, among the plurality of cells 60, the cell group to which the weight (−512 to −1) of the negative half smaller than the reference value 0 is associated is referred to as a negative cell group, while the cell group to which the weight (0 to +511) of the positive half equal to or more than the reference value is associated is referred to as a positive cell group. The method of associating weights with each of the plurality of cells 60 is not limited to this example, and may be another example.

The shift register 52 is, for example, a charge coupled device (CCD). In the case of using a CCD as the shift register 52, each of the plurality of cells 60 included in the shift register 52 stores electric charges as information. The shift register 52 may be a logic circuit. The shift register 52 may be a line-shaped memristor. Furthermore, the shift register 52 may be an indium gallium zinc oxide (IGZO) semiconductor containing indium (In), gallium (Ga) and zinc (Zn).

The initialization circuit 42 writes information to any one cell 60 out of the plurality of cells 60 included in the shift register 52 for each of the plurality of storage circuits 50. In this case, the initialization circuit 42 controls not to write information to cells 60 other than the cell 60 as a write target cell. For example, the initialization circuit 42 erases all information stored in the plurality of cells 60 included in the shift register 52, and then writes the information to any one cell 60.

For example, the initialization circuit 42 may receive an initial value of the weight from the learning control circuit 22 for each of the plurality of storage circuits 50, and may write information to the cell 60 at a position corresponding to the received initial value. Furthermore, for example, when the initialization circuit 42 has received an initialization instruction from the learning control circuit 22, the initialization circuit 42 may write information to the cell 60 at a position randomly selected for each of the plurality of storage circuits 50.

The update control circuit 44 receives an update amount for the weight from the learning control circuit 22 for each of the plurality of storage circuits 50. The update amount includes a sign and an absolute value. The sign indicates whether the weight is to be increased or decreased. The absolute value represents a change amount in weight. When the update control circuit 44 has received the update amount of the weight from the learning control circuit 22 for each of the plurality of storage circuits 50, the update control circuit 44 gives a transfer control signal to the shift register 52 to shift the position of the cell 60 storing information in the direction corresponding to the sign of the update amount by the number of cells corresponding to the absolute value of the update amount.

When the readout control circuit 46 has received a readout instruction from the learning control circuit 22, the readout control circuit 46 reads out the information stored in the plurality of cells 60 for each of the plurality of storage circuits 50, and outputs an output value in accordance with the weight corresponding to the position of the cell 60 storing information. For example, the readout control circuit 46 determines whether the weight corresponding to the cell 60 that stores information is larger than a predetermined reference value for each of the plurality of storage circuits 50, and outputs a binary output value representing a determination result. For example, the readout control circuit 46 determines whether the cell 60 storing the information is included in the positive cell group or the negative cell group, and outputs a binary output value representing the determination result. After the learning process is completed, the readout control circuit 46 gives the inference weight storage circuit 16 the binary output values read out from each of the plurality of storage circuits 50 as a plurality of inference weights.

Furthermore, the learning control circuit 22 sometimes uses a plurality of weights stored in the plurality of storage circuits 50 in the middle of the learning process. In this case, the readout control circuit 46 gives the binary output value read out from each of the plurality of storage circuits 50 to the learning control circuit 22. Furthermore, the learning control circuit 22 sometimes uses a weight represented by a continuous value in the middle of the learning process. In this case, the readout control circuit 46 determines whether information is stored in each of the plurality of cells 60 for each of the plurality of storage circuits 50, and specifies the position of the cell 60 in which information is stored. The readout control circuit 46 outputs the weight corresponding to the position of the cell 60 in which the information is stored, as an output value.

Figure 5:
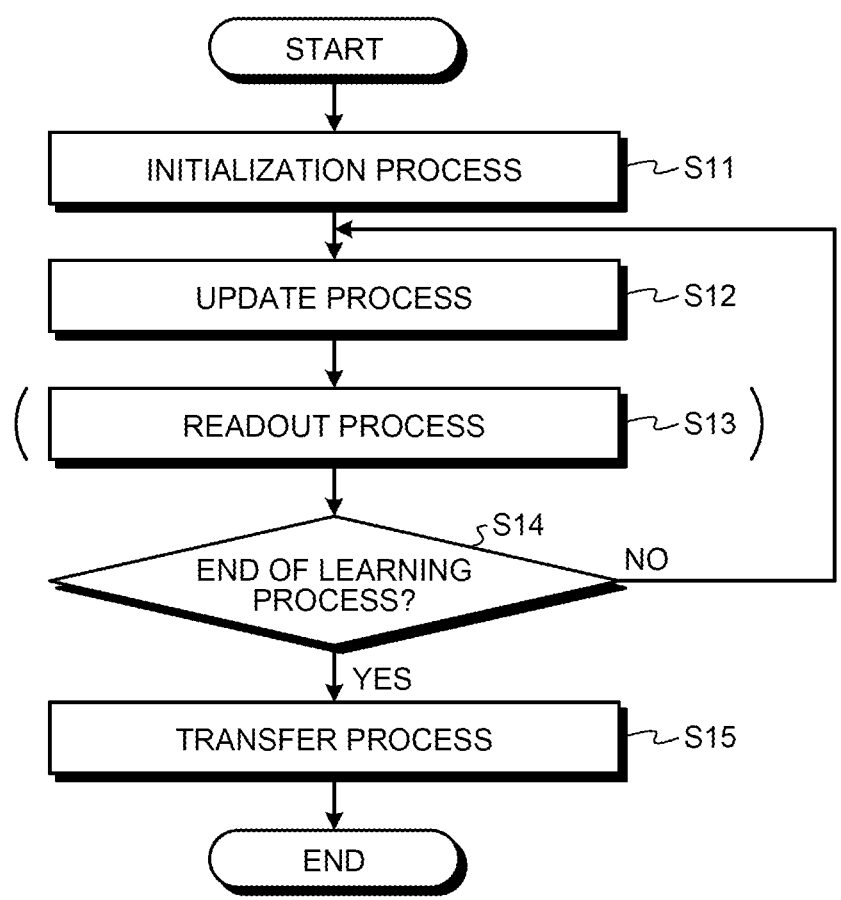
FIG. 5 is a flowchart illustrating an operation flow of a learning weight storage circuit.

FIG. 5 is a flowchart illustrating an operation flow of the learning weight storage circuit 20. The learning weight storage circuit 20 operates in the flow illustrated in FIG. 5 in accordance with the instruction from the learning control circuit 22 in the learning process.

First, in S11, the learning weight storage circuit 20 receives an initialization instruction and initial values of each of the plurality of weights from the learning control circuit 22, and executes the initialization process. In the initialization process, the learning weight storage circuit 20 writes information to each of the plurality of storage circuits 50 in the cell 60 at the position corresponding to the received initial value. In the initialization process, the learning weight storage circuit 20 may write information to the cell 60 at a position randomly selected for each of the plurality of storage circuits 50, rather than receiving the initial value.

Subsequently, in S12, the learning weight storage circuit 20 receives an update instruction and an update amount for each of the plurality of weights from the learning control circuit 22, and executes the update process. In the update process, the learning weight storage circuit 20 gives a transfer control signal to the shift register 52 for each of the plurality of storage circuits 50, and shifts the position of the cell 60 storing the information in a direction corresponding to the sign of the update amount by the number of cells corresponding to the absolute value of the update amount. This enables the learning weight storage circuit 20 to increase or decrease the weight stored in each of the plurality of storage circuits 50 by the update amount.

Subsequently, in S13, when having received a readout instruction from the learning control circuit 22, the learning weight storage circuit 20 executes a readout process. When not having received a readout instruction from the learning control circuit 22, the learning weight storage circuit 20 does not execute the readout process. The learning weight storage circuit 20 determines, in the readout process, whether the weight corresponding to the cell 60 that stores information is larger than a predetermined reference value for each of the plurality of storage circuits 50, and outputs an output value representing a determination result to the learning control circuit 22. For example, the learning weight storage circuit 20 determines whether the cell 60 storing the information is included in the positive cell group or the negative cell group for each of the plurality of storage circuit 50 and outputs a binary output value representing the determination result to the learning control circuit 22.

The learning control circuit 22 sometimes uses weights represented by continuous values in the learning process. In this case, the learning weight storage circuit 20 determines whether information is stored in each of the plurality of cells 60 for each of the plurality of storage circuits 50, and specifies the position of the cell 60 in which information is stored. The readout control circuit 46 outputs the weight corresponding to the position of the cell 60 in which the information is stored, as an output value.

The learning weight storage circuit 20 repeats the process of S12 and S13 until the learning process is completed (No of S14). This enables the learning weight storage circuit 20 to optimize a plurality of weights. After completion of the learning process (Yes in S14), the learning weight storage circuit 20 proceeds to the process of S15.

In S15, the learning weight storage circuit 20 receives a transfer instruction from the learning control circuit 22 and executes a transfer process. In the transfer process, the learning weight storage circuit 20 determines whether the weight corresponding to the cell 60 storing the information is larger than a predetermined reference value for each of the plurality of storage circuits 50, and outputs an output value representing the determination result to the inference weight storage circuit 16. For example, the learning weight storage circuit 20 determines whether the cell 60 storing the information is included in the positive cell group or the negative cell group for each of the plurality of storage circuit 50 and outputs a binary output value representing the determination result to the inference weight storage circuit 16.

After completion of the process of S15, the learning weight storage circuit 20 ends the present flow.

Figure 6:
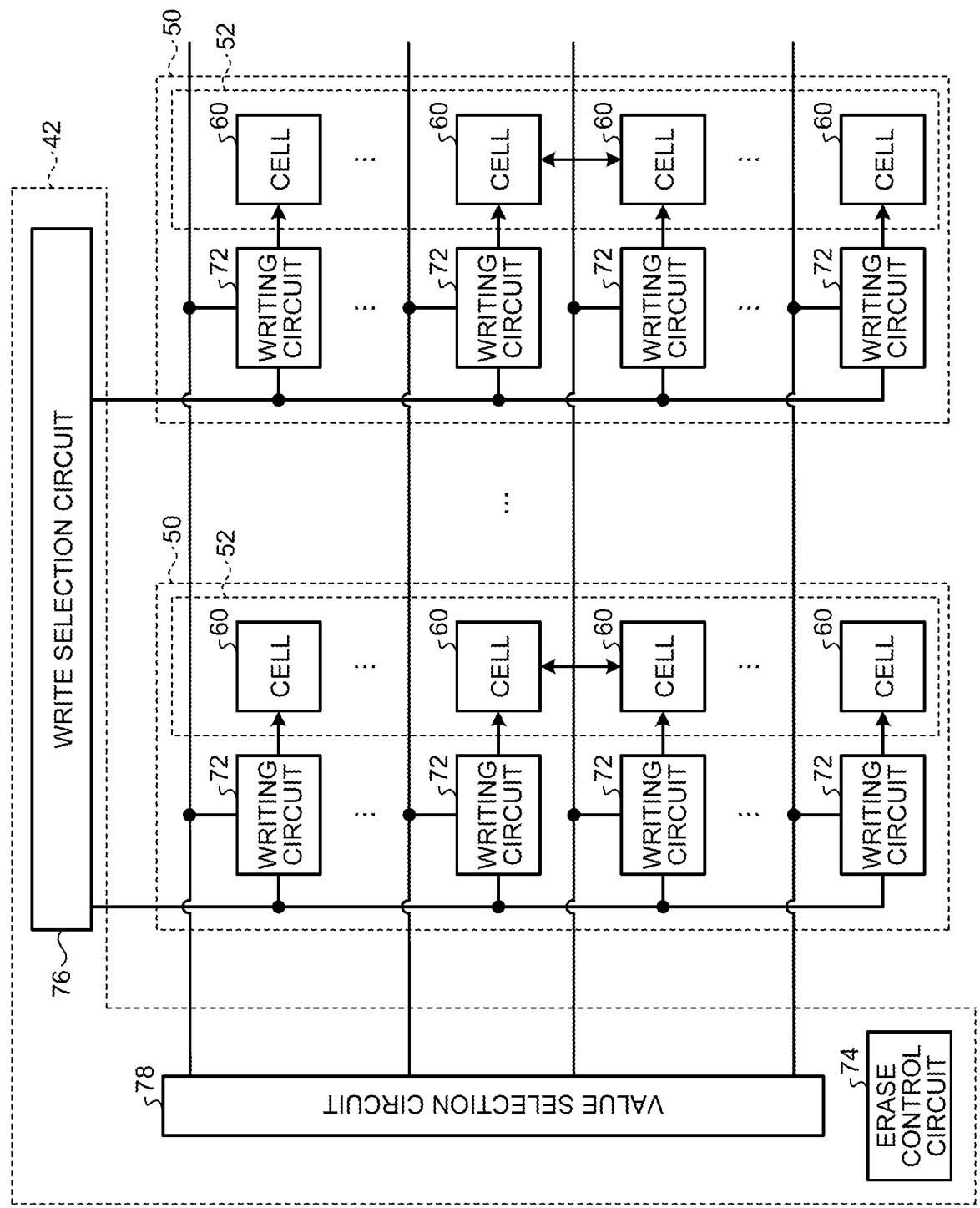
FIG. 6 is a diagram illustrating a configuration of an initialization circuit and a storage circuit for initialization processing.

FIG. 6 is a diagram illustrating an example of a configuration of the initialization circuit 42 and a configuration of the storage circuit 50 for the initialization process. For example, each of the plurality of storage circuits 50 further includes a plurality of writing circuits 72 for the initialization process.

The plurality of writing circuits 72 are provided to correspond to a plurality of cells 60 included in the shift register 52. For example, the plurality of writing circuits 72 corresponds one-to-one to the plurality of cells 60.

Each of the plurality of writing circuits 72 writes information to the corresponding cell 60 under the control of the initialization circuit 42. For example, in a case where the shift register 52 is a CCD, a predetermined amount of electric charge is injected into the corresponding cell 60.

The initialization circuit 42 includes an erase control circuit 74, a write selection circuit 76, and a value selection circuit 78.

The erase control circuit 74 erases the information stored in the plurality of cells 60 included in the shift register 52 before new information is wrote to the cell 60 of each of the plurality of storage circuits 50. The erase control circuit 74 shifts the shift registers 52 of the plurality of storage circuits 50 in the forward or reverse direction by the total number of cells so as to be in a state that there is none of stored information in any of the plurality of cells 60.

Under the control of the learning control circuit 22, the write selection circuit 76 selects the storage circuit 50 as a write target from among the plurality of storage circuits 50. For example, the weight storage circuit 40 includes a plurality of writing circuit selection lines 76-1 corresponding to the plurality of storage circuits 50. Each of the plurality of writing circuit selection lines 76-1 is connected to all of the plurality of writing circuits 72 included in the corresponding storage circuit 50. For example, the write selection circuit 76 applies a predetermined voltage to the writing circuit selection line 76-1 corresponding to the storage circuit 50 as a write target among the plurality of writing circuit selection lines 76-1. This enable the write selection circuit 76 to select the storage circuit 50 as a write target.

Under the control of the learning control circuit 22, the value selection circuit 78 selects the writing circuit 72 that corresponds to the cell 60 at the position corresponding to the initial value of the weight among the plurality of writing circuits 72 included in the storage circuit 50 as a write target. The value selection circuit 78 causes the selected writing circuit 72 to write information.

For example, the weight storage circuit 40 includes a plurality of write cell selection lines 78-1 corresponding to the plurality of cells 60 included in the shift register 52. Each of the plurality of write cell selection lines 78-1 is connected to the writing circuit 72 corresponding to the corresponding cell 60. Furthermore, each of the plurality of write cell selection lines 78-1 is commonly connected to the plurality of writing circuits 72 corresponding to the cells 60 at the same position included in the plurality of storage circuits 50. For example, the value selection circuit 78 applies a predetermined voltage to the write cell selection line 78-1 corresponding to the cell 60 at the position corresponding to the initial value of the weight among the plurality of write cell selection lines 78-1. This enables the value selection circuit 78 to select the writing circuit 72 corresponding to the cell 60 at the position corresponding to the initial value of the weight.

Then, when a predetermined voltage is applied to both the writing circuit selection line 76-1 and the write cell selection line 78-1 connected to each of the writing circuits 72, the writing circuit 72 electrically writes information to the corresponding cell 60. This enables the value selection circuit 78 to write information to the writing circuit 72 that corresponds to the cell 60 at the position corresponding to the initial value of the weight among the plurality of writing circuits 72 included in the storage circuit 50 as a write target.

When the shift register 52 is formed in a semiconductor device and a plurality of the cells 60 is formed in parallel on a certain plane on a semiconductor film, each of the plurality of writing circuits 72 may be formed directly above the semiconductor film in the corresponding cell 60, in the vertical direction. This makes is possible to reduce the area of the plane when the weight storage circuit 40 is formed in the semiconductor device.

Furthermore, when the shift register 52 is a CCD, the plurality of writing circuits 72 may accumulate electric charges in the corresponding cell 60 by application of light to the corresponding cell 60.

Furthermore, each of the plurality of storage circuits 50 may include only the writing circuit 72 corresponding to the cell 60 at any one predetermined position among the plurality of cells 60 included in the shift register 52. In this case, after the information is written in the cell 60 at the predetermined position, the value selection circuit 78 gives a transfer control signal to the shift register 52 to shift the position of the cell 60 storing the information, thereby storing the information in the cell 60 corresponding to the initial value of the weight.

Furthermore, the initial value received from the learning control circuit 22 may be a randomly determined value. Furthermore, the value selection circuit 78 may randomly determine the initial value in a case where an initialization instruction has been received from the learning control circuit 22.

Figure 7:
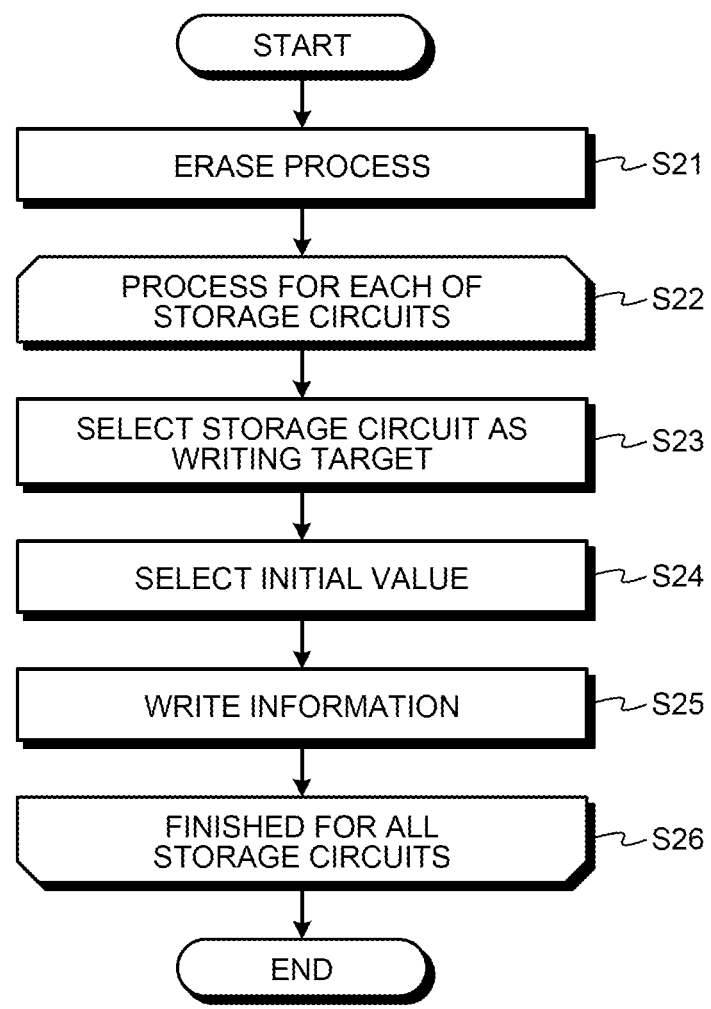
FIG. 7 is a flowchart illustrating an operation flow at the time of initialization.

FIG. 7 is a flowchart illustrating an example of an operation flow of the learning weight storage circuit 20 at a time of initialization. At the time of initialization, the learning weight storage circuit 20 performs processing according to the flow illustrated in FIG. 7, for example.

First, in S21, the learning weight storage circuit 20 erases the information stored in the plurality of cells 60 included in each of the shift registers 52 of the plurality of storage circuits 50. For example, the learning weight storage circuit 20 shifts the shift registers 52 of the plurality of storage circuits 50 in the forward or reverse direction by the total number of cells so as to be in a state that there is none of stored information in any of the plurality of cells 60.

Subsequently, in the loop processing between S22 and S26, the learning weight storage circuit 20 executes the processes of S23 to S25 for each of the plurality of storage circuits 50.

In S23, the learning weight storage circuit 20 selects the storage circuit 50 as a writing target from among the plurality of storage circuits 50. For example, the learning weight storage circuit 20 applies a predetermined voltage to the writing circuit selection line 76-1 corresponding to the storage circuit 50 as a writing target among the plurality of writing circuit selection lines 76-1.

Subsequently, in S24, the learning weight storage circuit 20 selects the writing circuit 72 that corresponds to the cell 60 at the position corresponding to the initial value of the weight among the plurality of writing circuits 72 included in the storage circuit 50 as a write target. For example, the learning weight storage circuit 20 applies a predetermined voltage to the write cell selection line 78-1 corresponding to the cell 60 at the position corresponding to the initial value of the weight among the plurality of write cell selection lines 78-1. The initial value may be a randomly determined value.

Subsequently, in S25, the learning weight storage circuit 20 causes the writing circuit 72 selected from the plurality of writing circuits 72 included in the storage circuit 50 as a writing target to write information to the corresponding cell 60. For example, the writing circuit 72 connected to both the writing circuit selection line 76-1 to which a predetermined voltage is applied and the write cell selection line 78-1 to which a predetermined voltage is applied writes information to the corresponding cell 60.

After executing the processes S23 to S25 for all of the plurality of storage circuits 50, the learning weight storage circuit 20 ends the present flow. The learning weight storage circuit 20 as described above writes information to any one cell 60 out of the plurality of cells 60 included in the shift register 52 for each of the plurality of storage circuits 50 in the initialization process.

Figure 8:
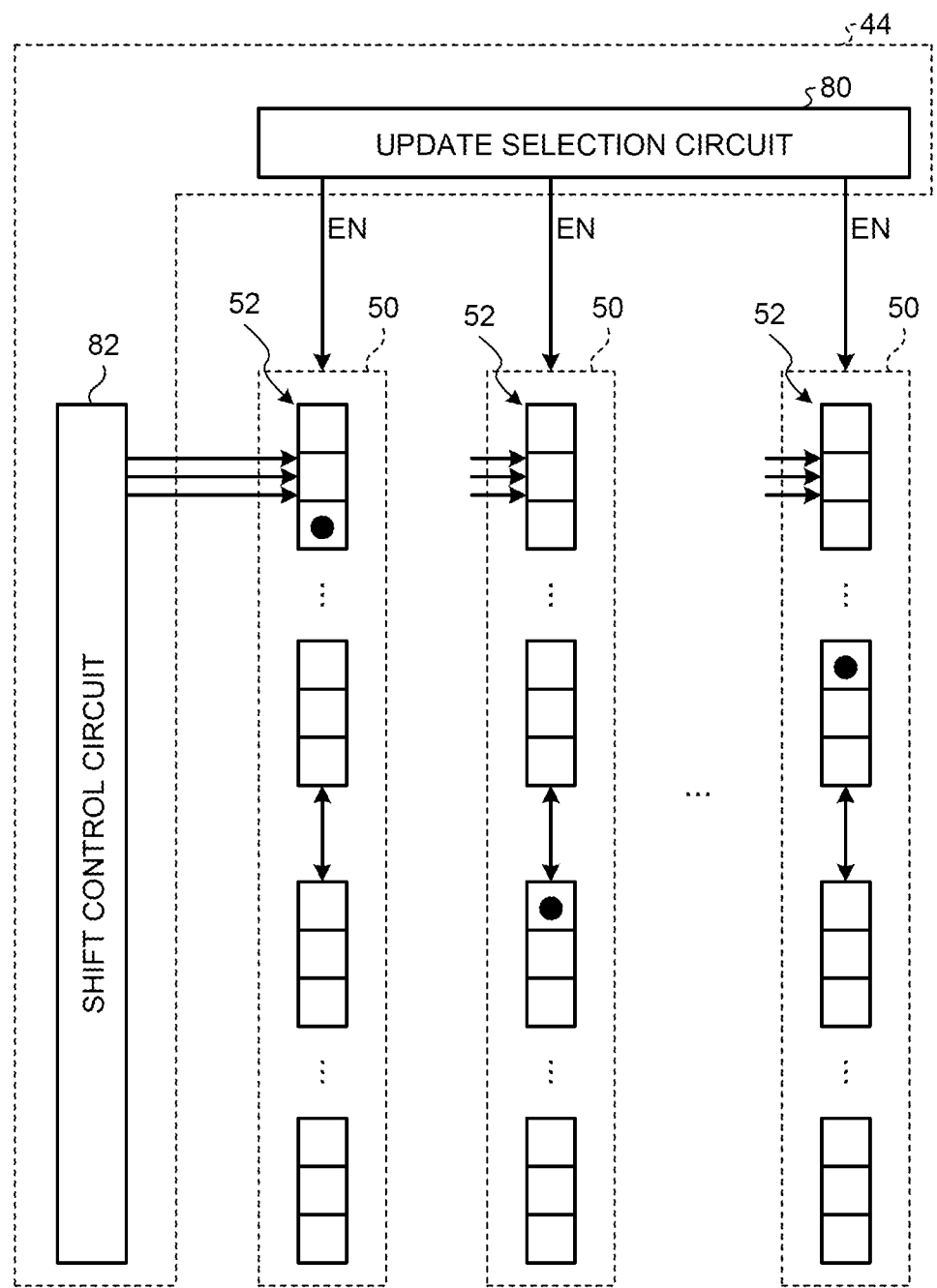
FIG. 8 is a diagram illustrating a first example of a configuration of an update control circuit and a storage circuit for update processing.

FIG. 8 is a diagram illustrating a configuration of the update control circuit 44 according to the first example and a configuration of the storage circuit 50 for the update process according to the first example. The update control circuit 44 according to the first example includes an update selection circuit 80 and a shift control circuit 82.

Under the control of the learning control circuit 22, the update selection circuit 80 selects the storage circuit 50 as an update target from the plurality of storage circuits 50. For example, each of the plurality of storage circuits 50 performs a shift operation when it has received an enable (EN) signal, and does not perform the shift operation when it has not received an enable signal. In this case, the update selection circuit 80 gives an enable signal to the shift register 52 included in the storage circuit 50 as an update target, and does not give an enable signal to the shift register 52 included in the other storage circuits 50. This enables the update selection circuit 80 to select the storage circuit 50 as an update target.

Under the control of the learning control circuit 22, the shift control circuit 82 shifts the position of the cell 60 storing the information in the shift register 52 included in the storage circuit 50 as an update target in the direction corresponding to the sign of the update amount by the number of cells according to the absolute value of the update amount. For example, the shift control circuit 82 commonly provides the plurality of shift registers 52 with a transfer control signal for simultaneously shifting the plurality of shift registers 52 included in the plurality of storage circuits 50. For example, when the shift register 52 is a CCD, the shift control circuit 82 commonly gives a three-phase transfer control signal (Vφ1, Vφ2, and Vφ3) to the plurality of shift registers 52. Although FIG. 8 is a schematic illustration in which three-phase transfer control signals (Vφ1, Vφ2, and Vφ3) are given to one cell 60, the shift control circuit 82 gives three-phase transfer control signals (Vφ1, Vφ2, and Vφ3) to all of the plurality of cells 60.

Among the plurality of shift registers 52, the shift register 52 to which the enable signal is given shifts the position of the cell 60 storing information according to the given transfer control signal. However, among the plurality of shift registers 52, the shift register 52 to which the enable signal is not given does not shift the position of the cell 60 storing the information even when the transfer control signal is given. This enables the shift control circuit 82 to shift the position of the cell 60 storing the information in the shift register 52 included in the storage circuit 50 as an update target in the direction corresponding to the sign of the update amount by the number of cells according to the absolute value of the update amount.

Figure 9:
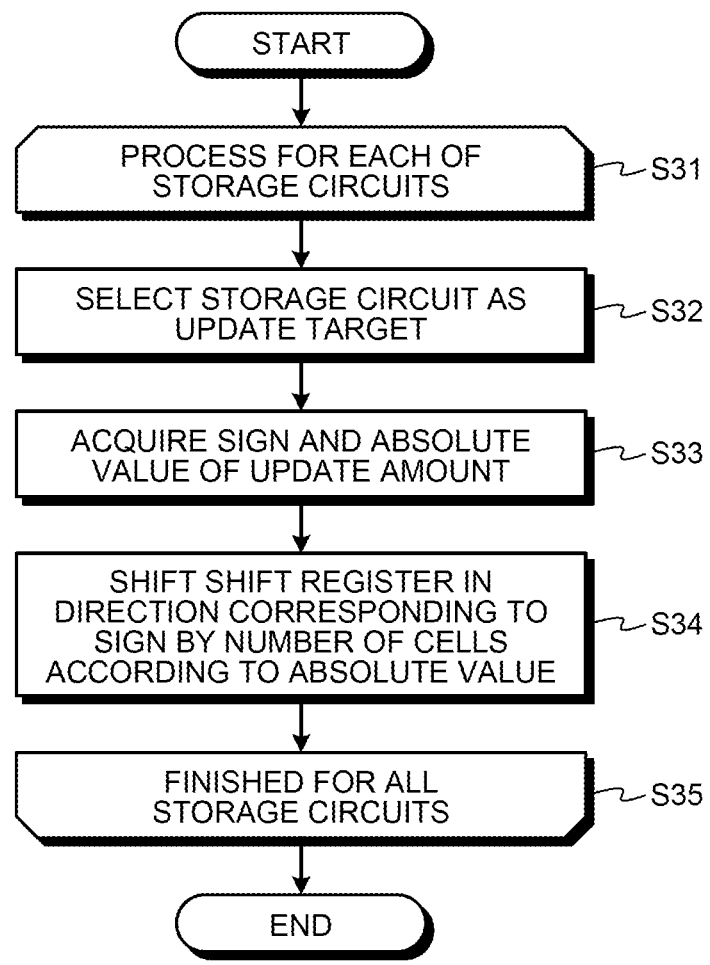
FIG. 9 is a flowchart illustrating an operation flow at the time of updating in the first example.

FIG. 9 is a flowchart illustrating an operation flow of the learning weight storage circuit 20 at the time of updating in the first example. At the time of updating, the learning weight storage circuit 20 according to the first example illustrated in FIG. 8 performs processing in the flow illustrated in FIG. 9, for example.

First, in the loop processing between S31 and S35, the learning weight storage circuit 20 executes the processes of S32 to S34 for each of the plurality of storage circuits 50.

In S32, the update selection circuit 80 selects the storage circuit 50 as an update target from the plurality of storage circuits 50. For example, the update selection circuit 80 gives an enable signal to the shift register 52 included in the storage circuit 50 to be updated, and does not give an enable signal to the shift register 52 included in the other storage circuits 50.

Subsequently, in S33, the shift control circuit 82 acquires, from the learning control circuit 22, the sign and the absolute value of the update amount of the weight stored in the storage circuit 50 as an update target.

Subsequently, in S34, the shift control circuit 82 shifts the position of the cell 60 storing the information in the shift register 52 included in the storage circuit 50 as an update target in the direction corresponding to the sign of the update amount by the number of cells according to the absolute value of the update amount. For example, the shift control circuit 82 controls the transfer control signal to shift the shift register 52.

In S35, after executing the processes from S32 to S34 for all of the plurality of storage circuits 50, the learning weight storage circuit 20 ends the present flow. In the update process, the learning weight storage circuit 20 according to the first example as above can shift the position of the cell 60 storing the information in a direction corresponding to the sign of the update amount by the number of cells corresponding to the absolute value of the update amount, for each of the plurality of storage circuit 50.

Figure 10:
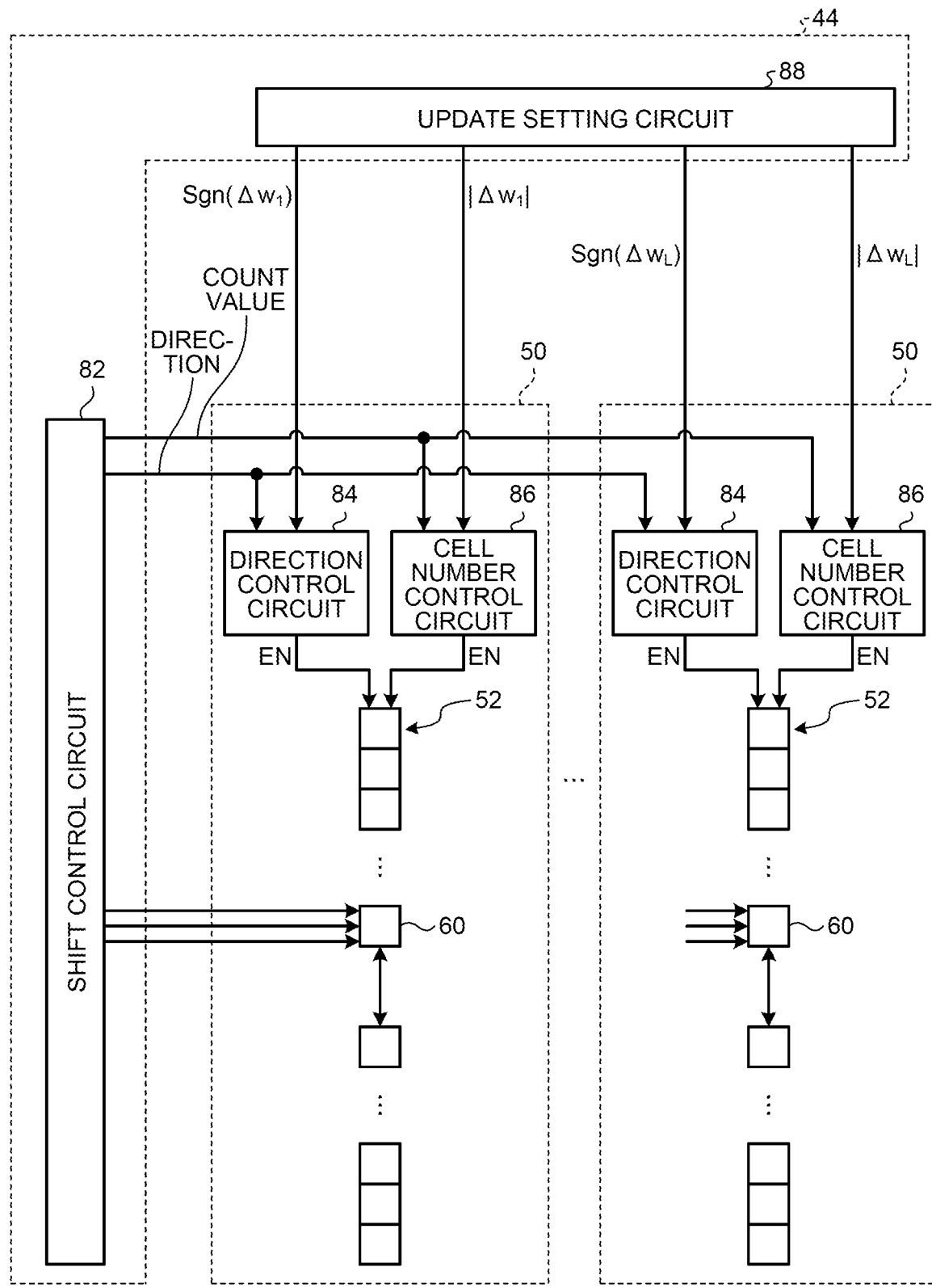
FIG. 10 is a diagram illustrating a configuration of an update control circuit and a storage circuit for update processing.

FIG. 10 is a diagram illustrating a configuration of the update control circuit 44 according to a second example and a configuration of the storage circuit 50 for the update process according to the second example. The update control circuit 44 and the weight storage circuit 40 may have a configuration of the second example illustrated in FIG. 10 instead of the configuration illustrated in FIG. 8, for example.

In the second example, each of the plurality of storage circuits 50 further includes a direction control circuit 84 and a cell number control circuit 86 for the update process, for example.

In the direction control circuit 84, the update control circuit 44 sets the sign of the update amount for updating the weight stored in the corresponding storage circuit 50. The direction control circuit 84 stores the sign of the set update amount. For example, the direction control circuit 84 stores a positive sign when the update amount is positive. Furthermore, when the update amount is negative, the direction control circuit 84 stores a negative sign. Subsequently, the direction control circuit 84 permits the shift register 52 to shift in a direction corresponding to the sign of the set update amount, and prohibits its shifts in a direction opposite to the direction corresponding to the sign of the set update amount.

For example, the direction control circuit 84 receives a direction signal indicating the shift direction of the shift register 52 from the shift control circuit 82. The direction control circuit 84 controls whether to give an enable signal to the shift register 52, in accordance with the sign of the set update amount and the direction indicated by the direction signal. For example, the direction control circuit 84 gives an enable signal when the sign of the update amount is positive and the direction signal indicates the forward direction, and when the sign of the update amount is negative and the direction signal indicates the reverse direction. On the other hand, the direction control circuit 84 does not give an enable signal when the sign of the update amount is positive and the direction signal indicates the reverse direction, and also when the sign of the update amount is negative and the direction signal indicates the forward direction. The shift register 52 does not perform the shift operation when the enable signal has not received from the direction control circuit 84. Accordingly, the direction control circuit 84 is able to permit the shift in a direction corresponding to the sign of the set update amount, and able to prohibit the shift of the shift register 52 in a direction opposite to the direction corresponding to the sign of the set update amount.

In the cell number control circuit 86, the update control circuit 44 sets the absolute value of the update amount for updating the weight stored in the corresponding storage circuit 50. The cell number control circuit 86 stores the absolute value of the set update amount. Subsequently, the cell number control circuit 86 permits the shift in the shift register 52 of a number of cells corresponding to the absolute value of the set update amount, or less, and prohibits its shifts of a number exceeding the number of cells corresponding to the absolute value of the set update amount.

For example, the cell number control circuit 86 receives a count value from the shift control circuit 82. The count value represents the number of cells that have been shifted since the shift was started in the forward or reverse direction. The count value increases by 1 from 0 at the start of the shift. The cell number control circuit 86 gives an enable signal to the shift register 52 when the count value is the absolute value of the update amount, or less, and does not give an enable signal to the shift register 52 when the count value becomes larger than the update amount. The shift register 52 does not perform the shift operation when the enable signal has not received from the cell number control circuit 86. This enables the cell number control circuit 86 to permit the shift in the shift register 52 of a number of cells corresponding to the absolute value of the set update amount, or less, and to prohibit its shifts of a number exceeding the number of cells corresponding to the absolute value of the set update amount.

In the second example, the update control circuit 44 includes an update setting circuit 88 and a shift control circuit 82.

The update setting circuit 88 receives the update amount of the stored weights for each of the plurality of storage circuits 50 under the control of the learning control circuit 22. Subsequently, the update setting circuit 88 sets the sign of the corresponding update amount for each of the direction control circuits 84 of the plurality of storage circuits 50. Furthermore, the update setting circuit 88 sets the absolute value of the corresponding update amount for each of the cell number control circuits 86 of the plurality of storage circuits 50.

The shift control circuit 82 collectively shifts the shift registers 52 included in the plurality of storage circuits 50 in one of the forward direction or the reverse direction by a predetermined number of cells under the control of the learning control circuit 22. Subsequently, the shift control circuit 82 collectively shifts the shift registers 52 included in the plurality of storage circuits 50 in the other direction of the forward direction or the reverse direction by a predetermined number of cells.

For example, the shift control circuit 82 produces a transfer control signal enabling simultaneously shifting the plurality of shift registers 52 included in the plurality of storage circuits 50. For example, when the shift register 52 is a CCD, the shift control circuit 82 commonly gives a three-phase transfer control signal (V$\phi$1, V$\phi$2, and V$\phi$3) to the plurality of shift registers 52.

In this case, the shift control circuit 82 gives a directional signal indicating whether the shift is made in the forward direction or the reverse direction to the direction control circuit 84 included in each of the plurality of storage circuits 50. Furthermore, during a period of shifting for a predetermined number of cells after the start of the shift in the forward direction, the shift control circuit 82 gives a count value indicating the number of cells shifted to the cell number control circuit 86 included in each of the plurality of storage circuits 50. Furthermore, during a period of shifting for a predetermined number of cells after the start of the shift in the reverse direction, the shift control circuit 82 gives a count value indicating the number of cells shifted to the cell number control circuit 86 included in each of the plurality of storage circuits 50.

On condition that the enable signal has been given from the direction control circuit 84 and the enable signal has been given from the cell number control circuit 86, the shift register 52 in each of the plurality of storage circuits 50 shifts the stored information according to the transfer control signal. However, the shift register 52 stored in each of the plurality of storage circuits 50 will not shift the stored information in a case where a transfer control signal has been given and an enable signal has not given from either the direction control circuit 84 or the cell number control circuit 86. Accordingly, each of the plurality of storage circuits 50 can shift the shift register 52 in the direction corresponding to the sign of the update amount set to itself by the number of cells corresponding to the absolute value of the update amount set to itself.

Figure 11:
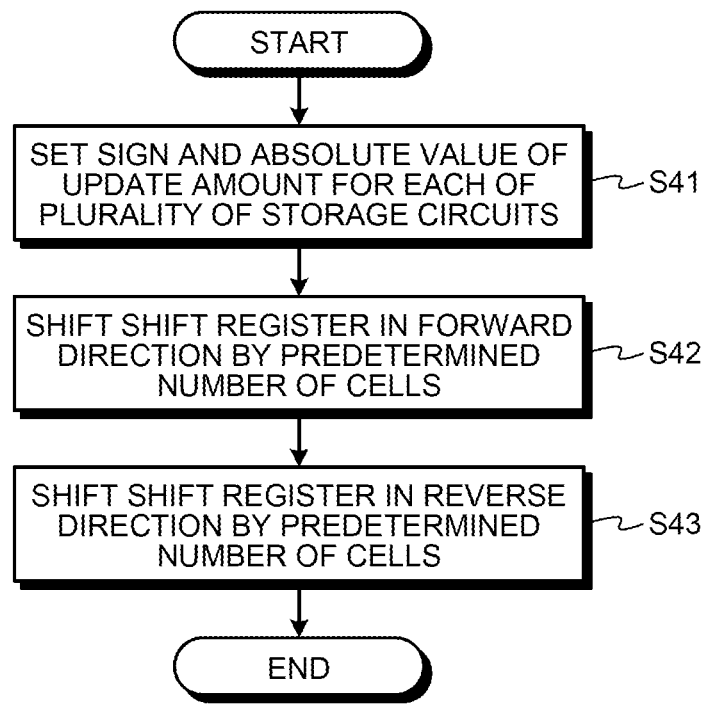
FIG. 11 is a flowchart illustrating an operation flow at the time of updating in a second example.

FIG. 11 is a flowchart illustrating an operation flow of the learning weight storage circuit 20 at the time of updating in the second example. At the time of updating, the learning weight storage circuit 20 according to the second example illustrated in FIG. 10 performs processing in the flow illustrated in FIG. 11, for example.

First, in S41, the update setting circuit 88 acquires the sign and the absolute value of the update amount of the stored weight for each of the plurality of storage circuits 50 from the learning control circuit 22. Subsequently, the update setting circuit 88 sets the sign of the update amount in the direction control circuit 84 and the absolute value of the update amount in the cell number control circuit 86 for each of the plurality of storage circuits 50.

Subsequently, in S42, the shift control circuit 82 collectively shifts the shift registers 52 included in each of the plurality of storage circuits 50 in the forward direction by a predetermined number of cells. In this case, the shift control circuit 82 gives a directional signal indicating that the shift is made in the forward direction to the direction control circuit 84 included in each of the plurality of storage circuits 50. Furthermore, after the start of the shift in the forward direction, the shift control circuit 82 gives a count value indicating the number of cells shifted to the cell number control circuit 86 included in each of the plurality of storage circuits 50. This enables the shift register 52 included in each of the plurality of storage circuits 50 to shift the position of the cell 60 storing the information in the forward direction by the number of cells corresponding to the absolute value set in the cell number control circuit 86 in a case where the positive sign is set in the direction control circuit 84.

Subsequently, in S43, the shift control circuit 82 collectively shifts the shift registers 52 included in each of the plurality of storage circuits 50 in the reverse direction by a predetermined number of cells. In this case, the shift control circuit 82 gives a directional signal indicating that the shift is made in the reverse direction to the direction control circuit 84 included in each of the plurality of storage circuits 50. Furthermore, after the start of the shift in the reverse direction, the shift control circuit 82 gives a count value indicating the number of cells shifted to the cell number control circuit 86 included in each of the plurality of storage circuits 50. This enables the shift register 52 included in each of the plurality of storage circuits 50 to shift the position of the cell 60 storing the information in the reverse direction by the number of cells corresponding to the absolute value set in the cell number control circuit 86 in a case where the negative sign is set in the direction control circuit 84.

After completion of the process of S43, the learning weight storage circuit 20 ends the present flow. The learning weight storage circuit 20 may execute S43 and then execute S42.

Furthermore, the predetermined number of cells to be shifted collectively in S42 and S43 may be the number of all cells 60 included in the shift register 52. Furthermore, there might be a case where a maximum value and a minimum value of the update amount output by the learning control circuit 22 are predetermined. In this case, the number of predetermined number of cells may be any number as long as the number may be the maximum value of the absolute value of the update amount that the update control circuit 44 can receive from the learning control circuit 22, or more. That is, the predetermined number of cells may be any value as long as it is equal to or more than the greater value out of the absolute value of the maximum value of the receivable update amount or the absolute value of the minimum value of the receivable update amount.

In the update process, the learning weight storage circuit 20 according to the second example as above can shift the position of the cell 60 storing information in a direction corresponding to the sign of the update amount by the number of cells corresponding to the absolute value of the update amount, for each of the plurality of storage circuit 50. Furthermore, the learning weight storage circuit 20 according to the second example can collectively shift cell positions by the number of cells with respect to the plurality of storage circuits 50 in the update process.

Figure 12:
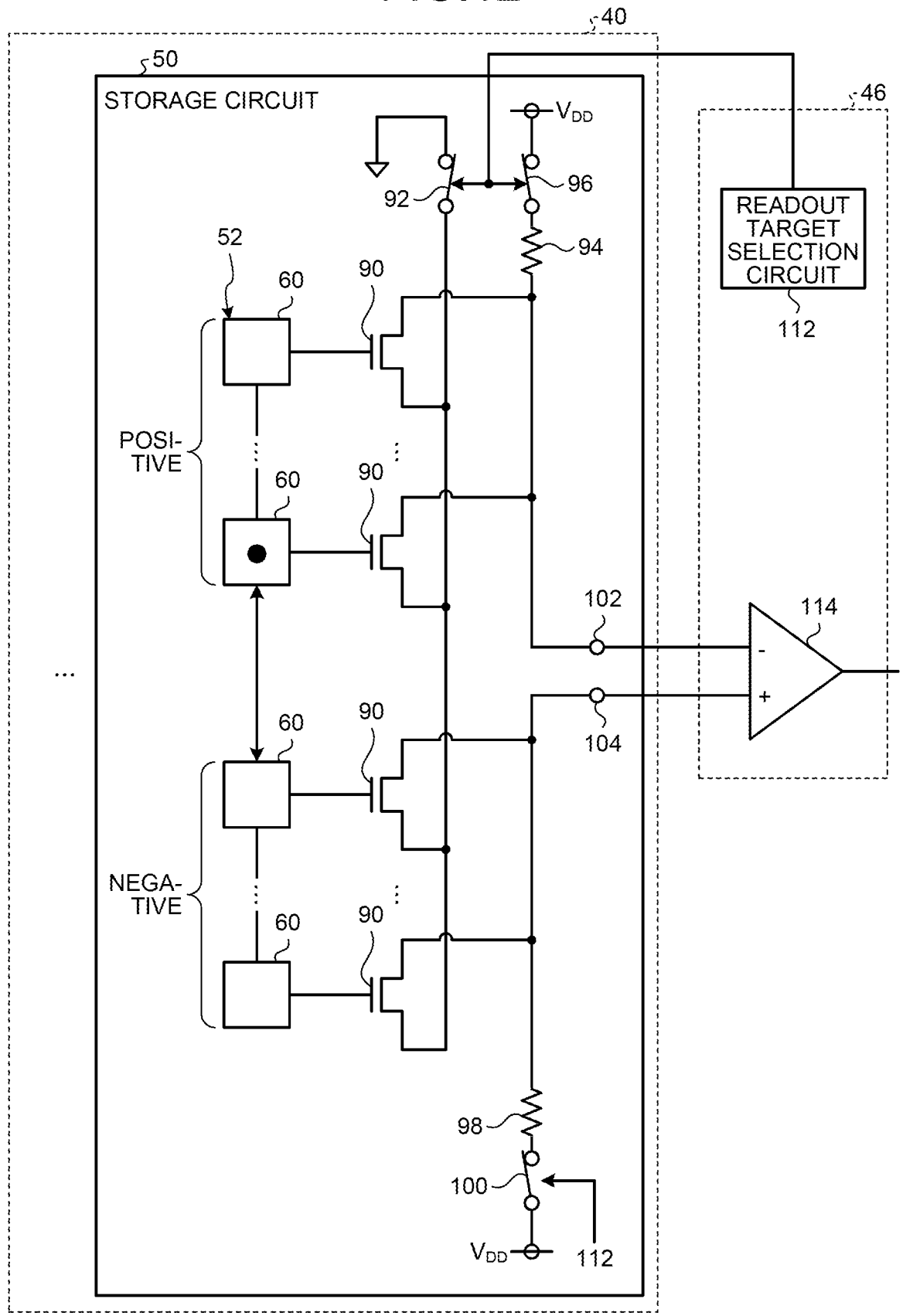
FIG. 12 is a diagram illustrating a configuration of a readout control circuit and a storage circuit for readout process.

FIG. 12 is a diagram illustrating a configuration of the readout control circuit 46 and a configuration of the storage circuit 50 for the readout process.

For the readout process, each of the plurality of storage circuits 50 further includes, for example, a plurality of readout circuits 90, a ground switch 92, a positive resistor 94, a positive switch 96, a negative resistor 98, a negative switch 100, a positive output terminal 102, and a negative output terminal 104.

The plurality of readout circuits 90 has a one-to-one correspondence with the plurality of cells 60 included in the shift register 52. Each of the plurality of readout circuits 90 outputs a signal that depends on whether information is stored in the corresponding cell 60.

In the present example, the readout circuit 90 is a metal-oxide-semiconductor field effect transistor (MOSFET). In this case, the readout circuit 90 has a configuration in which the gate is connected to the corresponding cell 60 and the source is connected to the ground via the ground switch 92. Furthermore, the drain of the readout circuit 90 corresponding to the positive cell group is connected to the positive output terminal 102. The drain of the readout circuit 90 corresponding to the negative cell group is connected to the negative output terminal 104.

The ground switch 92 switches whether or not to enable the functions of the plurality of readout circuits 90 under the control of the readout control circuit 46. In the present example, the ground switch 92 switches whether or not to connect the sources of the plurality of MOSFETs, which are the plurality of readout circuits 90, to the ground. In order to enable the functions of the plurality of readout circuits 90, the ground switch 92 is turned on to connect all sources of the plurality of MOSFETs to the ground. In order to disable the functions of the plurality of readout circuits 90, the ground switch 92 is turned off to disconnect all sources of the plurality of MOSFETs from the ground.

The positive resistor 94 is connected, on one terminal, to the positive output terminal 102, and connected, on the other terminal, to power supply voltage ($V_{DD}$) via the positive switch 96.

The positive switch 96 performs switching as to whether to enable the functions of the plurality of readout circuits 90 corresponding to the positive cell group among the plurality of readout circuits 90 included in the storage circuit 50 under the control of the readout control circuit 46. Among the plurality of cells 60, the positive cell group is a cell group to which the weight of half of the negative side (for example, 0 to +511) is associated. In the present example, the positive switch 96 switches whether or not to connect the terminal on the side not connected to the positive output terminal 102 of the positive resistor 94, to the power supply voltage ($V_{DD}$). In order to enable the function of the plurality of readout circuits 90 corresponding to the positive cell group, the positive switch 96 is turned on to connect the positive resistor 94 to the power supply voltage ($V_{DD}$). In order to disable the function of the plurality of readout circuits 90 corresponding to the positive cell group, the positive switch 96 is turned off to disconnect the positive resistor 94 from the power supply voltage ($V_{DD}$).

The negative resistor 98 is connected, on one terminal, to the negative output terminal 104, and connected, on the other terminal, to power supply voltage ($V_{DD}$) via the negative switch 100.

The negative switch 100 performs switching as to whether to enable the functions of the plurality of readout circuits 90 corresponding to the negative cell group among the plurality of readout circuits 90 included in the storage circuit 50 under the control of the readout control circuit 46. Among the plurality of cells 60, the negative cell group is a cell group to which the weight of half of the negative side (for example, −512 to −1) is associated. In the present example, the negative switch 100 switches whether or not to connect the terminal on the side not connected to the negative output terminal 104 of the negative resistor 98, to the power supply voltage ($V_{DD}$). In order to enable the function of the plurality of readout circuits 90 corresponding to the negative cell group, the negative switch 100 is turned on to connect the negative resistor 98 to the power supply voltage ($V_{DD}$). In order to disable the function of the plurality of readout circuits 90 corresponding to the negative cell group, the negative switch 100 is turned off to disconnect the negative resistor 98 from the power supply voltage ($V_{DD}$).

The positive output terminal 102 outputs a positive-side signal based on an electric signal output from the plurality of readout circuits 90 corresponding to the positive cell group. Furthermore, the negative output terminal 104 outputs a negative-side signal based on a plurality of electric signals output from the plurality of readout circuits 90 corresponding to the negative cell group.

In such a configuration, each of the plurality of readout circuits 90 is turned on when the information is stored in the corresponding cell 60, and turned off when the information is not stored in the corresponding cell 60. When turned on, each of the plurality of readout circuits 90 corresponding to the positive cell group is connected to the positive output terminal 102 and to the ground. When turned on, each of the plurality of readout circuits 90 corresponding to the negative cell group is connected to the negative output terminal 104 and to the ground.

Therefore, the positive-side signal output from the positive output terminal 102 becomes the ground potential when the information is stored in at least one cell 60 of the positive cell group, and becomes the power supply potential ($V_{DD}$) when no information is stored in any cell 60 in the positive cell group. Accordingly, the positive-side signal indicates whether information is stored in at least one cell 60 of the positive cell group, or whether information is not stored in any of the cells 60.

Furthermore, the negative-side signal output from the negative output terminal 104 becomes the ground potential when the information is stored in at least one cell 60 of the negative cell group, and becomes the power supply potential ($V_{DD}$) when no information is stored in any cell 60 in the negative cell group. Accordingly, the negative-side signal indicates whether information is stored in at least one cell 60 of the negative cell group, or whether information is not stored in any of the cells 60.

The readout control circuit 46 includes a readout target selection circuit 112 and a comparator circuit 114.

The readout target selection circuit 112 selects one storage circuit 50 as a readout target from the plurality of storage circuits 50 under the control of the learning control circuit 22. In the present example, the readout target selection circuit 112 turns on the ground switch 92, the positive switch 96, and the negative switch 100 included in the storage circuit 50 as a readout target, thereby enabling the functions of and a plurality of readout circuits 90 included in the storage circuit 50 as a readout target.

The comparator circuit 114 compares: the level of a positive-side signal output from the positive output terminal 102 of the selected storage circuit 50 as a readout target; and the level of a negative-side signal output from the negative output terminal 104 of the selected storage circuit 50 as a readout target. Here, the shift register 52 stores information in any one cell 60, and does not store information in any other cell 60. Therefore, one of the positive-side signal and the negative-side signal is at a level indicating that no information is stored in any of the cells 60, and the other is at a level at which information is stored in at least one cell 60. That is, the levels of the positive-side signal and the negative-side signal are different. Therefore, the comparator circuit 114 can compare the magnitudes of the positive-side signal and the negative-side signal.

Then, the comparator circuit 114 outputs a comparison result between the positive-side signal and the negative-side signal as an output value for the selected storage circuit 50 as a readout target. The readout control circuit 46 having such a configuration can output an output value obtained by binarizing the weight stored in the storage circuit 50 as a readout target.

The readout control circuit 46 may output the weights stored in the storage circuit 50 as a readout target in continuous values without performing binarization. In this case, the readout control circuit 46 identifies the cell 60 that stores information from among the plurality of cells 60 included in the shift register 52, based on the signal output from each of the plurality of readout circuits 90 included in the selected storage circuit 50 as a readout target. Subsequently, the readout control circuit 46 outputs a weight corresponding to the position of the specified cell 60 as an output value for the selected storage circuit 50 as a readout target.

Figure 13:
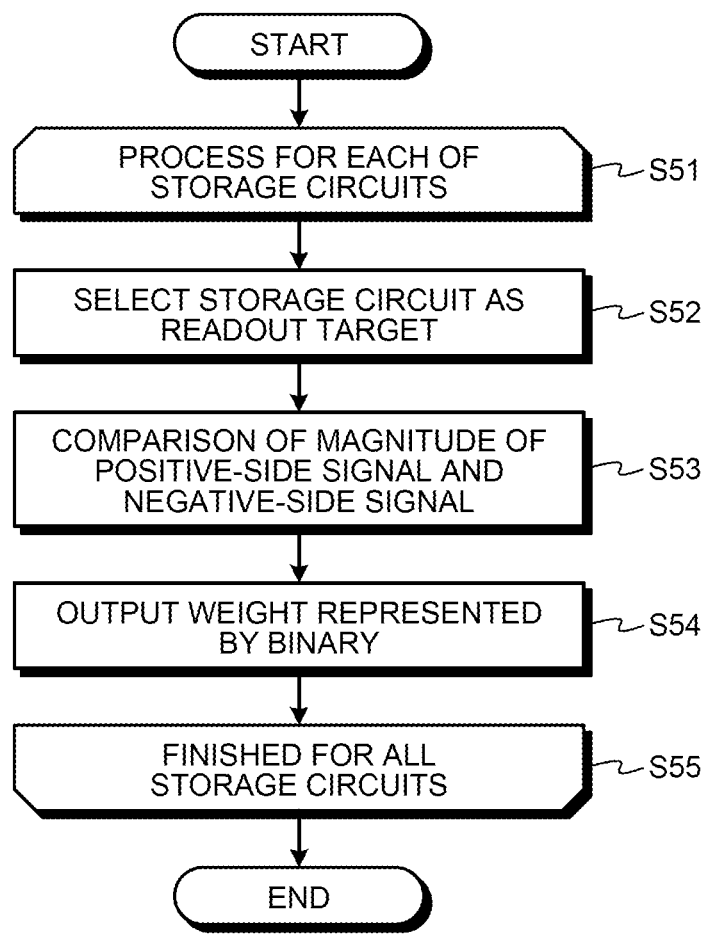
FIG. 13 is a flowchart illustrating an operation flow at the time of readout.

FIG. 13 is a flowchart illustrating an operation flow of the learning weight storage circuit 20 at the time of readout. At the time of readout, the learning weight storage circuit 20 illustrated in FIG. 12 performs processing in the flow illustrated in FIG. 13, for example.

First, in the loop processing between S51 and S55, the learning weight storage circuit 20 executes the processes of S52 to S54 for each of the plurality of storage circuits 50.

In S52, the readout target selection circuit 112 selects the storage circuit 50 as a readout target from among the plurality of storage circuits 50. For example, the readout target selection circuit 112 turns on the ground switch 92, the positive switch 96, and the negative switch 100 included in the readout target storage circuit 50.

Subsequently, in S53, the comparator circuit 114 compares the magnitude of the positive-side signal output from the storage circuit 50 as a readout target with the magnitude of the negative-side signal output from the storage circuit 50 as a readout target. That is, the comparator circuit 114 determines which of the positive cell group or the negative cell group stores the information.

Subsequently, in S54, the comparator circuit 114 outputs, as a weight represented in binary, the comparison result between the positive-side signal and the negative-side signal. In S55, after executing the processes from S52 to S54 for all of the plurality of storage circuits 50, the learning weight storage circuit 20 ends the present flow. The learning weight storage circuit 20 as described above can read out, in the readout process, the information stored in the plurality of cells 60 for each of the plurality of storage circuits 50, and can output an output value in accordance with the weight corresponding to the position of the cell 60 storing information.

Figure 14:
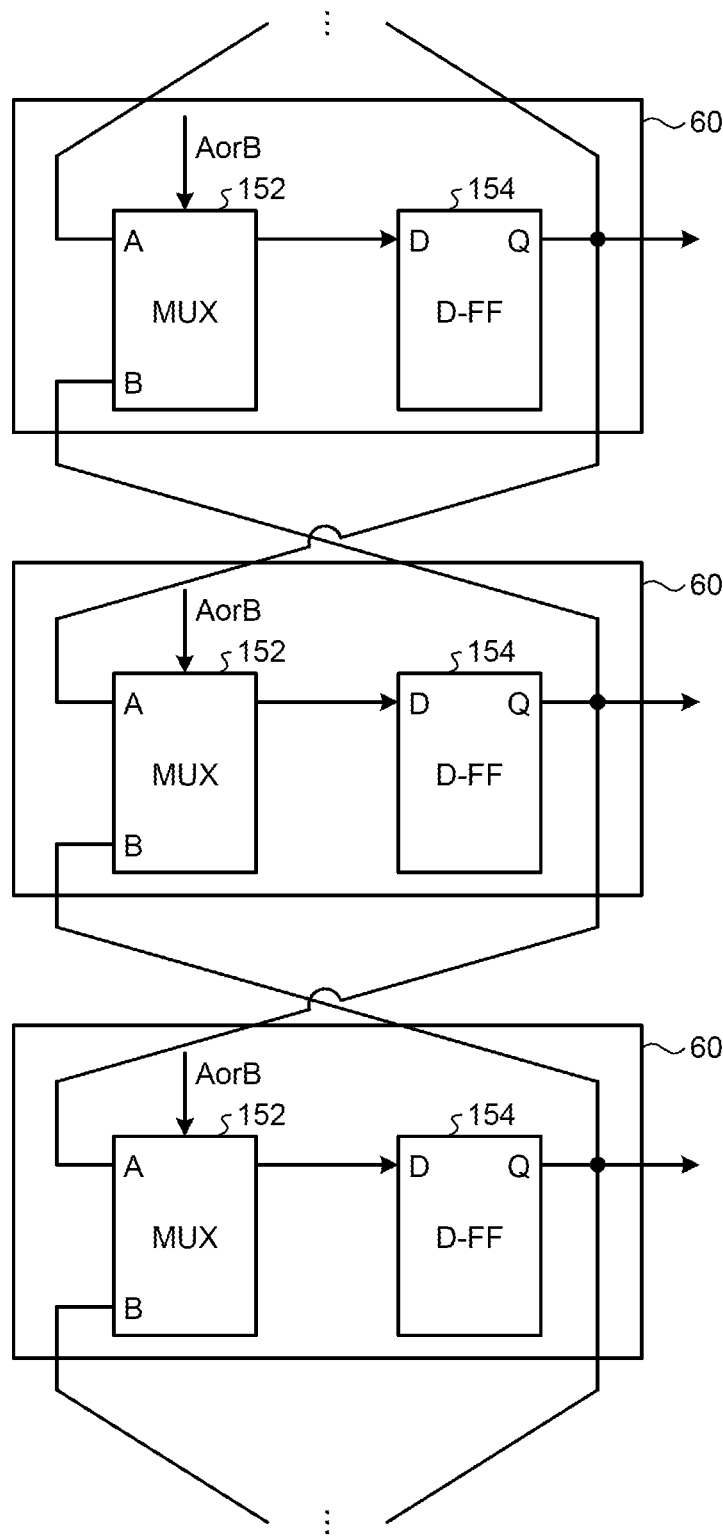
FIG. 14 is a diagram illustrating a configuration of a shift register including a logic circuit.

FIG. 14 is a diagram illustrating a configuration of the shift register 52 including a logic circuit. The shift register 52 may be a logic circuit. For example, each of the plurality of cells 60 may have a configuration as illustrated in FIG. 14.

Each of the plurality of cells 60 includes a multiplexer 152 and a D flip-flop 154.

The multiplexer 152 outputs a value input to the designated input terminal out of the two input terminals. In the case of the example of FIG. 14, the multiplexer 152 outputs the value input from either a first input terminal (A) or a second input terminal (B).

The D flip-flop 154 has an input of a clock signal and stores a value input from the D terminal for one cycle period of the clock signal. The D flip-flop 154 outputs the stored value from the Q terminal.

The D terminal of the D flip-flop 154 acquires the value output from the multiplexer 152. The first input terminal (A) of the multiplexer 152 acquires a value output from the Q terminal of the D flip-flop 154 included in the cell 60 at one upper position. The second input terminal (B) of the multiplexer 152 acquires a value output from the Q terminal of the D flip-flop 154 included in the cell 60 at one lower position.

A clock signal is given to the D flip-flop 154 in the case of a shift operation of the shift register 52. Furthermore, the multiplexer 152 has an input of a directional signal indicating whether to shift in the forward direction or the reverse direction. The second input terminal (B) is designated when shift operation is to be performed in the forward direction, while the first input terminal (A) is designated when shift operation is to be performed in the reverse direction.

The shift register 52 having such a configuration can store information (bits) in any one of the plurality of cells 60. Furthermore, the shift register 52 having such a configuration can shift the information (bits) by one cell at a time in the forward direction or the reverse direction. The shift register 52 including the logic circuit is not limited to the configuration illustrated in FIG. 14, and may have other configurations.

Figure 15:
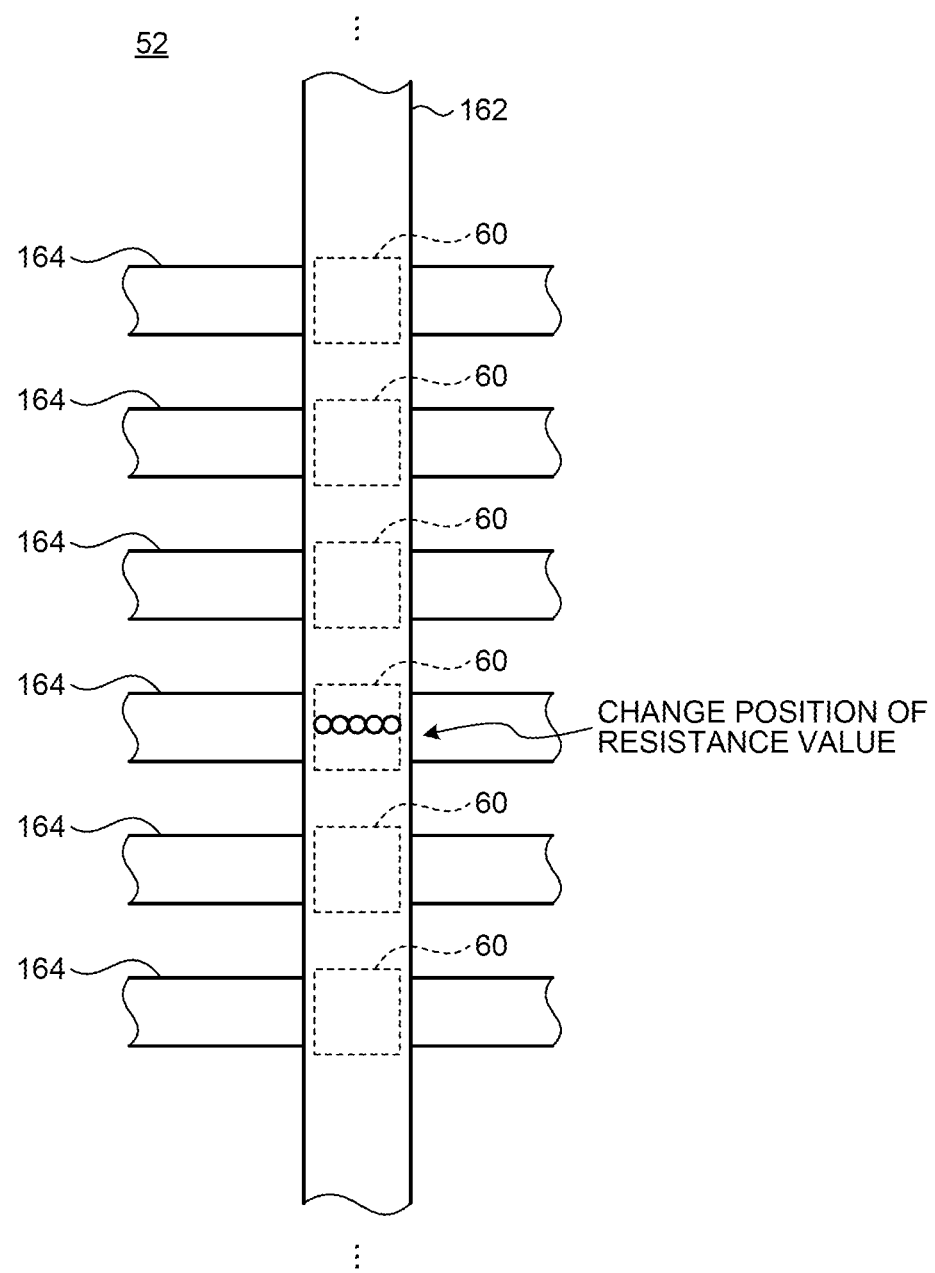
FIG. 15 is a diagram illustrating a configuration of a shift register including a memristor.

FIG. 15 is a diagram illustrating a configuration of a shift register 52 including a memristor. The shift register 52 may include a memristor 162 and a plurality of control lines 164.

The memristor 162 has a line shape extending in a predetermined direction, for example. The memristor 162 can store the resistance value as information.

A range delimited by a predetermined length in a direction along the line in the memristor 162 forms the cell 60 of the shift register 52. In addition, each of the plurality of cells 60 formed side by side in the direction along the line stores a resistance value as information.

In the memristor 162, the position where a resistance value has changed can move in the direction along the line by external control using the plurality of control lines 164. Therefore, by moving the position where the resistance value has changed, the memristor 162 can move the position where the information is stored in the direction along the line.

The shift register 52 having such a configuration can store information (resistance value) in any one of the plurality of cells 60 formed along the line of the memristor 162. Furthermore, the shift register 52 having such a configuration can shift the information (resistance value) by one cell at a time in the forward direction or the reverse direction.

Figure 16:
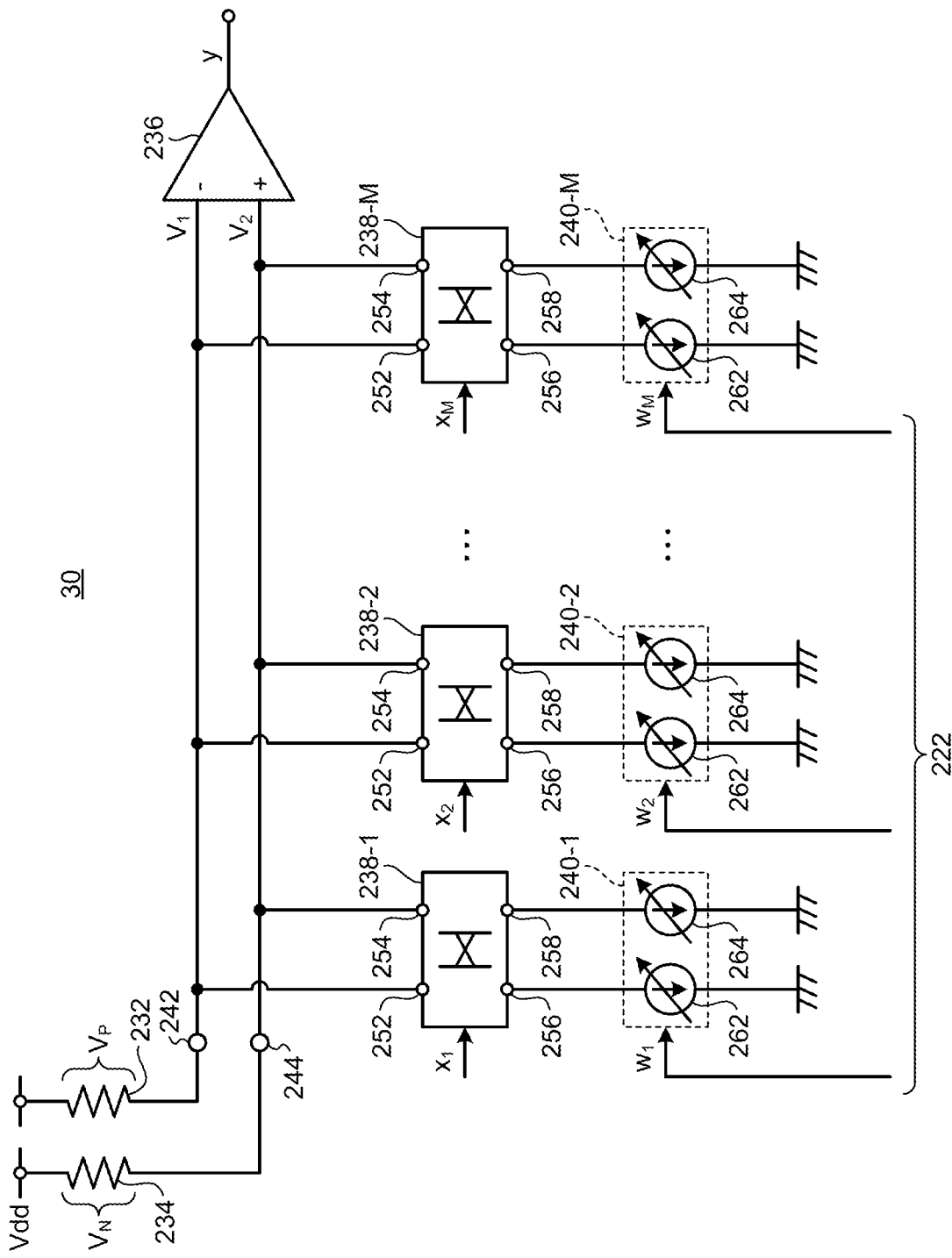
FIG. 16 is a hardware configuration diagram of a product-sum operation circuit.

FIG. 16 is a diagram illustrating a hardware configuration of the product-sum operation circuit 30. The product-sum operation circuit 30 is not limited to the configuration illustrated in FIG. 16, and may have other configurations.

The product-sum operation circuit 30 performs a product-sum operation of M weights ($w_1$ to $w_M$) and M input signals ($x_1$ to $x_M$). Note that each of the M weights ($w_1$ to $w_M$) is a part of a plurality of weights stored in the inference weight storage circuit 16 and is binary. Moreover, each of the M input signals ($x_1$ to $x_M$) is binary.

The product-sum operation circuit 30 includes a comparator 236, a first resistor 232, a second resistor 234, M cross switches 238, and M coefficient circuits 240.

The first resistor 232 is connected between a voltage source that generates a predetermined power supply voltage (Vdd) and a first comparison terminal 242. The second resistor 234 is connected between a voltage source that generates a predetermined power supply voltage (Vdd) and a second comparison terminal 244. The first resistor 232 and the second resistor 234 have the same resistance value.

The comparator 236 outputs an output signal (y) representing a value corresponding to a comparison result between a first voltage ($V_1$) generated at the first comparison terminal 242 and a second voltage ($V_2$) generated at the second comparison terminal 244. In the present embodiment, the comparator 236 outputs an output signal (y) representing −1 when the voltage obtained by subtracting the first voltage ($V_1$) from the second voltage ($V_2$) is less than 0. The comparator 236 outputs an output signal (y) representing +1 when the voltage obtained by subtracting the first voltage ($V_1$) from the second voltage ($V_2$) is 0 or more.

The voltage generated in the first resistor 232 is expressed as s positive-side voltage ($V_P$). The voltage generated in the second resistor 234 is expressed as a negative-side voltage ($V_N$). In this case, the first voltage ($V_1$) is Vdd−$V_P$. The second voltage ($V_2$) is Vdd−$V_N$. Therefore, in the present embodiment, the comparator 236 outputs an output signal (y) representing −1 when the voltage obtained by subtracting the negative-side voltage ($V_N$) from the positive-side voltage ($V_P$) is less than 0. Furthermore, in the present embodiment, the comparator 236 outputs an output signal (y) representing +1 when the differential voltage ($V_d$) obtained by subtracting the negative-side voltage ($V_N$) from the positive-side voltage ($V_P$) is 0 or more.

The M cross switches 238 are provided corresponding to M input signals. In the present embodiment, the product-sum operation circuit 30 includes a first cross switch 238-1 to an M-th cross switch 238-M as M cross switches 238. For example, the first cross switch 238-1 corresponds to the first input signal ($x_1$), the second cross switch 238-2 corresponds to the second input signal ($x_2$), and the M-th cross switch 238-M corresponds to the M-th input signal ($x_M$).

Each of the M cross switches 238 has a positive input terminal 252, a negative input terminal 254, a positive output terminal 256, and a negative output terminal 258.

On each of the M cross switches 238, the positive input terminal 252 is connected to the first comparison terminal 242. Furthermore, on each of the M cross switches 238, the negative input terminal 254 is connected to the second comparison terminal 244.

Each of the M cross switches 238 connects the positive output terminal 256 to either the positive input terminal 252 or the negative input terminal 254. Furthermore, each of the M cross switches 238 connects the negative output terminal 258 to the other of the positive input terminal 252 and the negative input terminal 254 to which the positive output terminal 256 is not connected. Each of the M cross switches 238 switches whether or not the positive output terminal 256 and the negative output terminal 258 are to be connected to which of the positive input terminal 252 or the negative input terminal 254 in accordance with the value of the corresponding input signal.

That is, each of the M cross switches 238 switches between a straight state and a reverse state in accordance with the value of the corresponding input signal. The straight state is a state where the positive input terminal 252 and the positive output terminal 256 are connected, and the negative input terminal 254 and the negative output terminal 258 are connected. The reverse state is a state where the positive input terminal 252 and the negative output terminal 258 are connected, and the negative input terminal 254 and the positive output terminal 256 are connected.

In the present embodiment, each of the M cross switches 238 is determined to be in the straight state when the corresponding input signal value is +1 and determined to be in the reverse state when the corresponding input signal value is −1. Instead, each of the M cross switches 238 may be determined to be in the reverse state when the corresponding input signal value is +1 and may be determined to be in the straight state when the corresponding input signal value is −1.

The M coefficient circuits 240 are provided corresponding to the M weights. In the present embodiment, the product-sum operation circuit 30 has a first coefficient circuit 240-1 to an M-th coefficient circuit 240-M as M coefficient circuits 240. For example, the first coefficient circuit 240-1 corresponds to the first weight ($w_1$), the second coefficient circuit 240-2 corresponds to the second weight ($w_2$), and the M-th coefficient circuit 240-M corresponds to the M-th weight ($w_M$).

The first weight ($w_1$) corresponds to the first input signal ($x_1$), the second weight ($w_2$) corresponds to the second input signal ($x_2$), and the M-th weight ($w_M$) corresponds to the M-th input signal ($x_M$). Therefore, the M cross switches 238 and the M coefficient circuits 240 have a one-to-one correspondence. For example, the first coefficient circuit 240-1 corresponds to the first cross switch 238-1, the second coefficient circuit 240-2 corresponds to the second cross switch 238-2, and the M-th coefficient circuit 240-M corresponds to the M-th cross switch 238-M.

Each of the M coefficient circuits 240 includes a first constant current source 62 and a second constant current source 64. The first constant current source 62 is connected at one end to the corresponding positive output terminal 256 of the cross switch 238 and connected at the other end to a reference potential (for example, ground). That is, the first constant current source 62 is connected between the positive output terminal 256 of the corresponding cross switch 238 and the reference potential.

Furthermore, the second constant current source 64 is connected at one end to the corresponding negative output terminal 258 of the cross switch 238 and connected at the other end to a reference potential (for example, ground). That is, the second constant current source 64 is connected between the negative output terminal 258 of the corresponding cross switch 238 and the reference potential.

Each of the first constant current source 62 and the second constant current source 64 is a constant current source. The positive and negative of the current difference of the first constant current source 62 and the second constant current source 64 are switched in accordance with the corresponding weight values. For example, the product-sum operation circuit 30 receives M weights prior to receiving M input signals. Subsequently, the product-sum operation circuit 30 sets the positive/negative of the current difference of the first constant current source 62 and the second constant current source 64 individually included in the corresponding coefficient circuit 240 in accordance with each of the received M weights.

Each of the M coefficient circuits 240 switches between a first state and a second state in accordance with the corresponding weights. The first state is a state where the first constant current source 62 provides a current of a first current value ($I_1$), while the second constant current source 64 provides a current of a second current value ($I_2$) different from the first current value ($I_1$). The second state is a state where the first constant current source 62 provides the current of the second current value ($I_2$) and the second constant current source 64 provides the current of the first current value ($I_1$).

In the present embodiment, the second current value ($I_2$) is smaller than the first current value ($I_1$). Therefore, in the present embodiment, the first state is a state where the current flowing through the first constant current source 62 is greater than the current flowing through the second constant current source 64. Furthermore, the second state is a state where the current flowing through the first constant current source 62 is less than the current flowing through the second constant current source 64.

In the present embodiment, each of the plurality of coefficient circuits 240 is determined to be in the first state when the corresponding weight is +1 and determined to be in the second state when the corresponding weight is −1. Alternatively, each of the plurality of coefficient circuits 240 may be determined to be in the second state when the corresponding weight is +1 and may be determined to be in the first state when the corresponding weight is −1.

Figure 17:
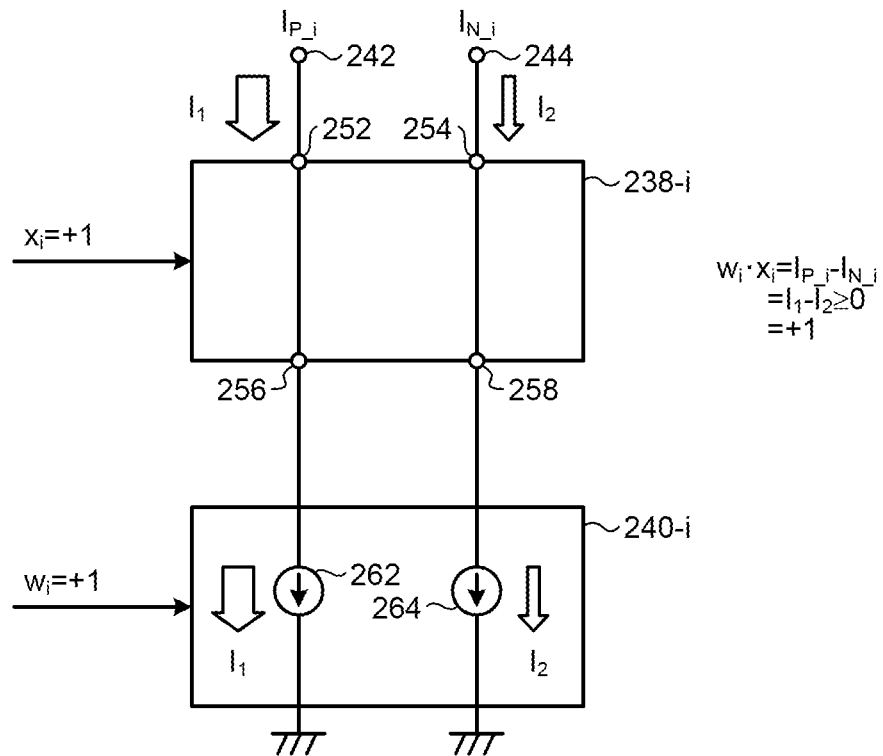
FIG. 17 is an illustration of an arithmetic operation when $x_i=+1$ and $w_i=+1$.

FIG. 17 is a diagram illustrating arithmetic operations of an i-th cross switch 238-$i$ and an i-th coefficient circuit 240-$i$ when $x_i$=+1 and $w_i$=+1.

When the i-th input signal ($x_i$) is +1, the i-th cross switch 238-$i$ is determined to be in the straight state. When the i-th weight ($w_i$) is +1, the i-th coefficient circuit 240-$i$ is determined to be in the first state. That is, when the i-th weight ($w_i$) is +1, the first constant current source 62 is set to provide the current of the first current value ($I_1$), and the second constant current source 64 is set to provide the current of the second current value ($I_2$). Here. $I_1 > I_2$.

Accordingly, when the i-th input signal ($x_i$) is +1 and the i-th weight ($w_i$) is +1, the i-th coefficient circuit 240-$i$ draws the current of the first current value ($I_1$) from the first comparison terminal 242 and draws the current of the second current value ($I_2$) from the second comparison terminal 244.

Here, in the product-sum operation circuit 30, the value ($w_i \cdot x_i$) obtained by multiplying the i-th weight ($w_i$) and the i-th input signal ($x_i$) is represented by a current difference ($I_{P\_i} - I_{N\_i}$) between a current ($I_{P\_i}$) flowing from the first comparison terminal 242 to the positive input terminal 252 of the i-th coefficient circuit 240-$i$ and a current ($I_{N\_i}$) flowing from the second comparison terminal 244 to the i-th coefficient circuit 240-$i$.

In the example of FIG. 17, $I_{P\_i}=I_1$ and $I_{N\_i}=I_2$ are established, and the current difference ($I_{P\_i} - I_{N\_i}$) will be a positive value. Therefore, when $x_i$=+1 and $w_i$=+1, the product-sum operation circuit 30 can calculate +1 as the value ($w_i \cdot x_i$) obtained by multiplying the i-th weight ($w_i$) and the i-th input signal ($x_i$).

Figure 18:
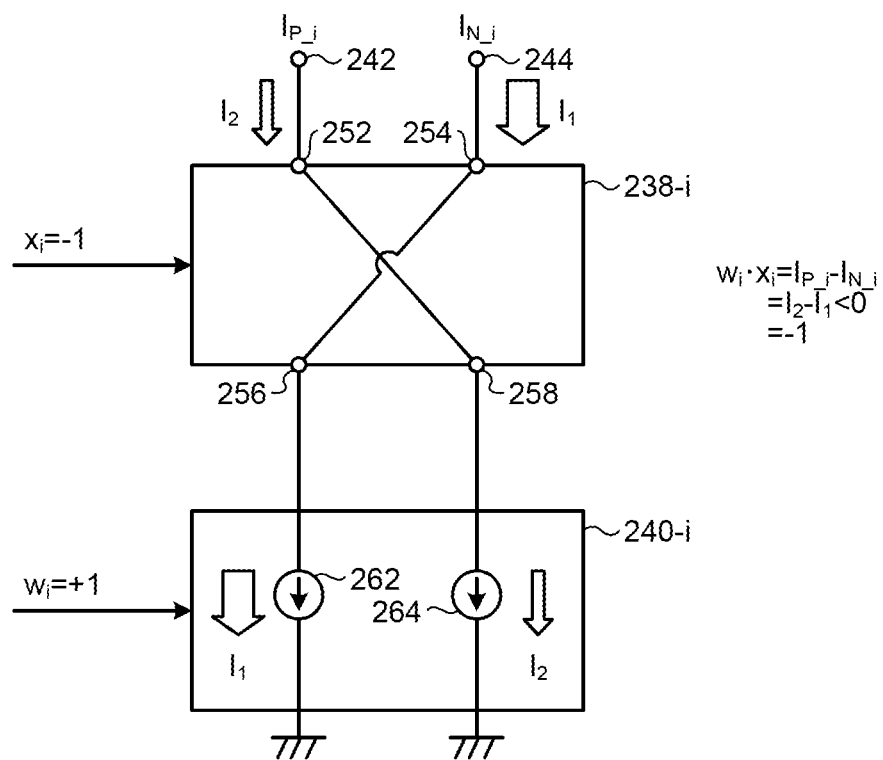
FIG. 18 is an illustration of an arithmetic operation when $x_i=-1$ and $w_i=+1$.

FIG. 18 is a diagram illustrating arithmetic operations of the cross switch 238-$i$ and the coefficient circuit 240-$i$ when $x_i$=−1 and $w_i$=+1.

When the i-th input signal ($x_i$) is −1, the i-th cross switch 238-$i$ is determined to be in the reverse state. When the i-th weight ($w_i$) is +1, the i-th coefficient circuit 240-$i$ is determined to be in the first state. That is, when the i-th weight ($w_i$) is +1, the first constant current source 62 is set to provide the current of the first current value ($I_1$), and the second constant current source 64 is set to provide the current of the second current value ($I_2$).

Accordingly, when the i-th input signal ($x_i$) is −1 and the i-th weight ($w_i$) is +1, the i-th coefficient circuit 240-$i$ draws the current of the second current value ($I_2$) from the first comparison terminal 242 and draws the current of the first current value ($I_1$) from the second comparison terminal 244.

In the example of FIG. 18, $I_{P\_i}=I_2$ and $I_{N\_i}=I_1$ are established, and the current difference ($I_{P\_i}-I_{N\_i}$) has a negative value. Therefore, when $x_i$=−1 and $w_i$=+1, the product-sum operation circuit 30 can calculate −1 as the value ($w_i \cdot x_i$) obtained by multiplying the i-th weight ($w_i$) and the i-th input signal ($x_i$).

Figure 19:
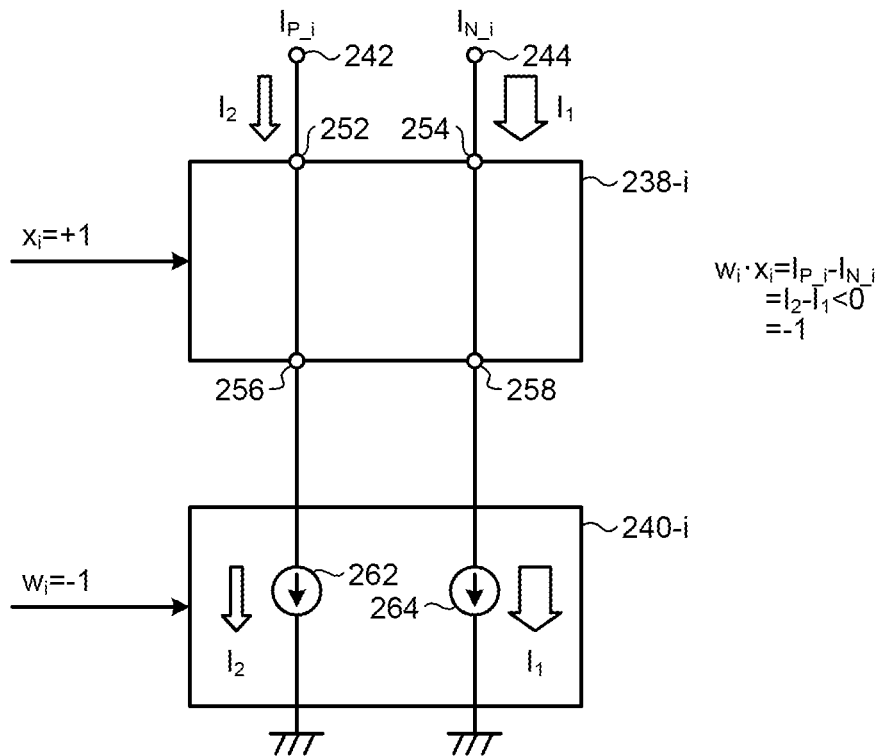
FIG. 19 is an illustration of an arithmetic operation when $x_i=+1$ and $w_i=-1$.

FIG. 19 is a diagram illustrating arithmetic operations of an i-th cross switch 238-$i$ and an i-th coefficient circuit 240-$i$ when $x_i$=+1 and $w_i$=−1.

When the i-th input signal ($x_i$) is +1, the i-th cross switch 238-$i$ is determined to be in the straight state. When the i-th weight ($w_i$) is −1, the i-th coefficient circuit 240-$i$ is determined to be in the second state. That is, when the i-th weight ($w_i$) is −1, the first constant current source 62 is set to provide the current of the second current value ($I_2$), and the second constant current source 64 is set to provide the current of the first current value ($I_1$).

Accordingly, when the i-th input signal ($x_i$) is +1 and the i-th weight ($w_i$) is −1, the i-th coefficient circuit 240-$i$ draws the current of the second current value ($I_2$) from the first comparison terminal 242 and draws the current of the first current value ($I_1$) from the second comparison terminal 244.

In the example of FIG. 19, $I_{P\_i}=I_2$ and $I_{N\_i}=I_1$ are established, and the current difference ($I_{P\_i}-I_{N\_i}$) has a negative value. Therefore, when $x_i$=+1 and $w_i$=−1, the product-sum operation circuit 30 can calculate −1 as the value ($w_i \cdot x_i$) obtained by multiplying the i-th weight ($w_i$) and the i-th input signal ($x_i$).

Figure 20:
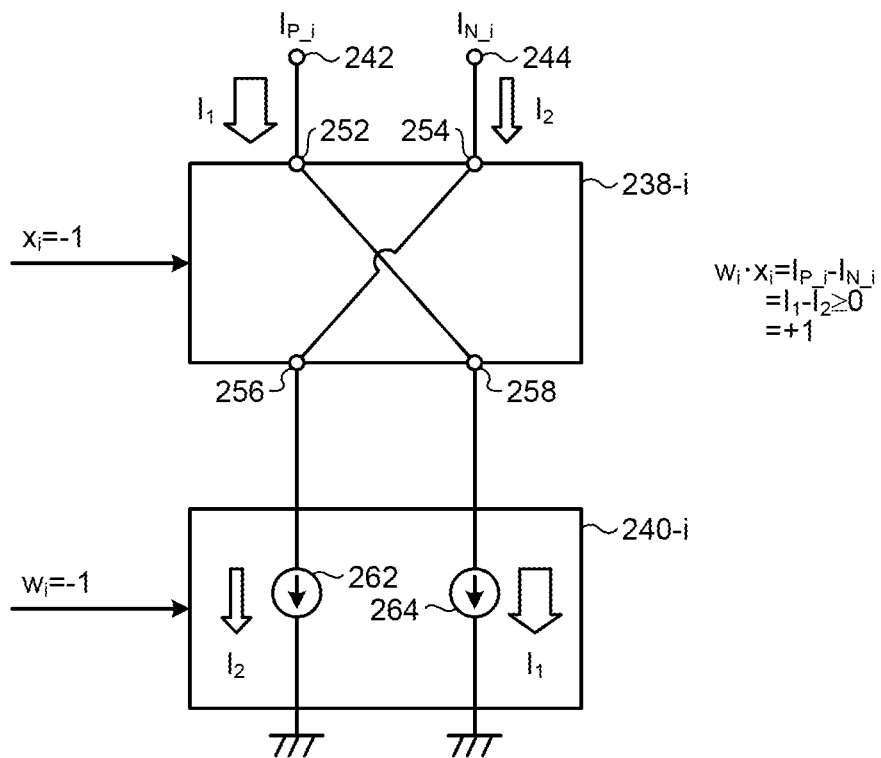
FIG. 20 is an illustration of an arithmetic operation when $x_i=-1$ and $w_i=-1$.

FIG. 20 is a diagram illustrating the arithmetic operation of the i-th cross switch 238-$i$ and the coefficient circuit 240-$i$ of the i-th when $x_i$=−1 and $w_i$=−1.

When the i-th input signal ($x_i$) is −1, the i-th cross switch 238-$i$ is determined to be in the reverse state. When the i-th weight ($w_i$) is −1, the i-th coefficient circuit 240-$i$ is determined to be in the second state. That is, when the i-th weight ($w_i$) is −1, the first constant current source 62 is set to provide the current of the second current value ($I_2$), and the second constant current source 64 is set to provide the current of the first current value ($I_1$).

Accordingly, when the i-th input signal ($x_i$) is −1 and the i-th weight ($w_i$) is −1, the i-th coefficient circuit 240-$i$ draws the current of the first current value ($I_1$) from the first comparison terminal 242 and draws the current of the second current value ($I_2$) from the second comparison terminal 244.

In the example of FIG. 20, $I_{P\_i}=I_1$ and $I_{N\_i}=I_2$ are established, and the current difference ($I_{P\_i}-I_{N\_i}$) will be a positive value. Therefore, when $x_i$=−1 and $w_i$=−1, the product-sum operation circuit 30 can calculate +1 as the value ($w_i \cdot x_i$) obtained by multiplying the i-th weight ($w_i$) and the i-th input signal ($x_i$).

FIG. 21 is a diagram illustrating operation of the comparator 236 and the voltage and current of the first resistor 232 and the second resistor 234.

In the present embodiment, when a differential voltage ($V_d$) obtained by subtracting a negative-side voltage ($V_N$) generated in the second resistor 234 from the positive-side voltage ($V_P$) generated in the first resistor 232 is 0 or more, the comparator 236 outputs an output signal (y) representing +1. Furthermore, in the present embodiment, the comparator 236 outputs an output signal (y) representing −1 when the differential voltage ($V_d$) is less than 0.

Let R be the resistance value of the first resistor 232 and the second resistor 234. In this case, the positive-side voltage ($V_P$) is the product of R and the positive-side current ($I_P$). The negative-side voltage ($V_N$) is the product of R and the negative-side current ($I_N$).

Therefore, the differential voltage ($V_d$) can be expressed by Formula (21).

$$V_d = V_P - V_N = R \times (I_P - I_N) \tag{21}$$

The positive-side current ($I_P$) is a current flowing through the first comparison terminal 242. That is, the positive-side current ($I_P$) is the total value of the current flowing through the positive input terminals 252 of the M cross switches 238. Therefore, the positive-side current ($I_P$) is calculated by ($I_{P\_1}+I_{P\_2}+\ldots+I_{P\_M}$).

The negative-side current ($I_N$) is the current flowing through the second comparison terminal 244. That is, the negative-side current ($I_N$) is the total value of the current flowing through the negative input terminals 254 of the M cross switches 238. Therefore, the negative-side current ($I_N$) is calculated by ($I_{N\_1}+I_{N\_2}+\ldots+I_{N\_M}$).

Therefore, the differential voltage ($V_d$) is expressed by Formula (22).

$$V_d = R \times \{(I_{P\_1}+I_{P\_2}+\ldots+I_{P\_M})-(I_{N\_1}+I_{N\_2}+\ldots+I_{N\_M})\} = \\ R \times \{(I_{P\_1}-I_{N\_1})+\ldots+(I_{P\_i}-I_{N\_i})+\ldots+(I_{P\_M}-I_{N\_M})\} \tag{22}$$

Here, as described in FIGS. 17 to 20, the current difference ($I_{P\_i}-I_{N\_i}$) is a value ($w_i \cdot x_i$) obtained by multiplying the i-th weight ($w_i$) and the i-th input signal ($x_i$).

Therefore, the differential voltage ($V_d$) can be expressed by Formula (23).

$$V_d \propto (\{(w_1 \cdot x_1)+\ldots+(w_i \cdot x_i)+\ldots+(w_M \cdot x_M)\} \tag{23}$$

The right side of Formula (23) represents the product-sum operation (multiply-accumulation) value of M input signals and M weights.

As described above, the differential voltage ($V_d$) is proportional to the product-sum operation (multiply-accumulation) value of M input signals and M weights. The output signal (y) is a binary signal indicating whether the differential voltage ($V_d$) is less than 0, or 0 or more. Accordingly, the output signal (y) indicates whether the product-sum operation (multiply-accumulation) value of M input signals and M weights is less than 0, or 0 or more. In this manner, the product-sum operation circuit 30 according to the present embodiment can execute the product-sum operation (multiply-accumulation) of M input signals and M weights by analog processing.

As described above, the learning weight storage circuit 20 according to the present embodiment enables high-precision storage of the weights that are continuous values by using the shift register 52. Furthermore, since the learning weight storage circuit 20 updates the weight by shifting the shift register 52, the weight can be increased or decreased with high precision by a minute amount. Therefore, the learning weight storage circuit 20 according to the present embodiment can achieve high-precision and high-speed learning of each of the plurality of weights at the time of learning applied to the neural network.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage device storing weights being continuous values, the storage device comprising:
a shift register including a plurality of cells, each being arranged in series and storing information, the shift register being capable of shifting a position of the cell storing the information among the plurality of cells in a forward direction and a reverse direction in units of cells, a position of each of the plurality of cells corresponding to the weight, the weight corresponding to each of the plurality of cells continuously increasing or decreasing together with a change in the position in the forward direction;
an initialization circuit configured to write the information to one of the plurality of cells included in the shift register;
an update control circuit configured to
receive an update amount of the weight, and
shift a position of the cell storing the information in a direction corresponding to a sign of the update amount by a number of cells corresponding to an absolute value of the update amount; and
a readout control circuit configured to
read out the information stored in the plurality of cells, and
output an output value according to the weight corresponding to the position of the cell storing the information.

2. A storage device comprising:
a plurality of storage circuits, each including a shift register and storing weights being continuous values;
an initialization circuit;
an update control circuit; and
a readout control circuit, wherein
the shift register includes a plurality of cells, each being arranged in series and storing information, the shift register being capable of shifting a position of the cell storing the information among the plurality of cells in a forward direction and a reverse direction in units of cells, a position of each of the plurality of cells corresponding to the weight, the weight corresponding to each of the plurality of cells continuously increasing or decreasing together with a change in the position in the forward direction,
the initialization circuit is configured to, for each of the plurality of storage circuits, write the information to one of the plurality of cells included in the shift register,
the update control circuit is configured to, for each of the plurality of storage circuits,
receive an update amount of the weight, and
shift a position of the cell storing the information in a direction corresponding to a sign of the update amount by a number of cells corresponding to an absolute value of the update amount, and
the readout control circuit is configured to, for each of the plurality of storage circuits,
read out the information stored in the plurality of cells, and
output an output value according to the weight corresponding to the position of the cell storing the information.

3. The storage device according to claim 2, wherein
each of the plurality of storage circuits further includes a plurality of writing circuits, each being provided to correspond to one of the plurality of cells,
each of the plurality of writing circuits writes the information to a corresponding one of the plurality of cells, and
the initialization circuit is configured to
select a storage circuit as a writing target from among the plurality of storage circuits, and
select a writing circuit that corresponds to the cell in the position corresponding to an initial value of the weight from among the plurality of writing circuits included in the storage circuit as the writing target, and
cause the selected writing circuit to write the information.

4. The storage device according to claim 2, wherein the initialization circuit is configured to, for each of the plurality of storage circuits, write the information to one of the plurality of cells included in the shift register, which is randomly determined.

5. The storage device according to claim 2, wherein the initialization circuit is configured to, for each of the plurality of storage circuits, write the information to the one of the cells after erasing the information stored in the plurality of cells included in the shift register.

6. The storage device according to claim 2, wherein
each of the plurality of storage circuits includes:
a direction control circuit in which the sign of the update amount is set, the direction control circuit being configured to prohibit a shift by the shift register in a direction opposite to the direction corresponding to the sign of the update amount; and
a cell number control circuit in which the absolute value of the update amount is set, the cell number control circuit being configured to prohibit a shift exceeding the number of cells corresponding to the absolute value of the update amount, and
the update control circuit is configured to, for each of the plurality of storage circuits, set the sign of the update amount in the direction control circuit and set the absolute value of the update amount in the cell number control circuit, and
the update control circuit is configured to cause the shift registers included in the plurality of storage circuits to be shifted in one of the forward direction and the reverse direction by a predetermined number of cells, and to be shifted in the other of the forward direction or the reverse direction by the predetermined number of cells.

7. The storage device according to claim 2, wherein the readout control circuit is configured to output, as the output value, a value indicating whether the weight corresponding to the cell storing the information is larger than a predetermined reference value.

8. The storage device according to claim 7, wherein
each of the plurality of storage circuits further includes a plurality of readout circuits provided corresponding to the plurality of cells,
each of the plurality of readout circuits is configured to
output a signal according to a result of whether the information is stored in the corresponding cell,
output a positive-side signal based on signals output from the plurality of readout circuits corresponding to a positive cell group corresponding to the weight of the reference value or more among the plurality of included readout circuits, the positive-side signal indicating whether the information is stored in at least one cell of the positive cell group or the information is not stored in any of the cells, and
output a negative-side signal based on signals output from the plurality of readout circuits corresponding to a negative cell group corresponding to the weight smaller than the reference value among the plurality of included readout circuits, the negative-side signal indicating whether the information is stored in at least one cell of the negative cell group or the information is not stored in any of the cells, and
the readout control circuit is configured to
select a storage circuit as a readout target from among the plurality of storage circuits,
compare magnitudes between positive-side signal and the negative-side signal output from the storage circuit selected as the readout target, and
output a comparison result between the positive-side signal and the negative-side signal, as an output value with respect to the storage circuit selected as the readout target.

9. The storage device according to claim 2, wherein the readout control circuit is configured to output, as the output value, the weight corresponding to the cell storing the information.

10. The storage device according to claim 1, wherein the shift register is a charge coupled device (CCD), and
each of the plurality of cells stores an electric charge as the information.

11. The storage device according to claim 1, wherein the shift register is a logic circuit.

12. The storage device according to claim 1, wherein
the shift register is a line-shaped memristor,
the memristor has a configuration in which
a position where a resistance value has changed can move in a direction along a line by external control,
a range delimited by a predetermined length in the direction along the line constitutes a cell, and
each of the plurality of cells stores the resistance value as the information.

13. A neural network apparatus comprising:
an arithmetic circuit configured to execute arithmetic processing according to a neural network;
an inference weight storage circuit configured to store a plurality of inference weights used in the arithmetic processing according to the neural network executed by the arithmetic circuit;
a learning weight storage circuit configured to, in a learning process of the neural network, store a plurality of weights being continuous values corresponding to the plurality of inference weights; and
a learning control circuit configured to
control, in the learning process, the learning weight storage circuit to update each of the plurality of weights based on an operation result of the arithmetic circuit, and,
control, after the learning process, the inference weight storage circuit to store, as the plurality of inference weights, the plurality of output values corresponding to the plurality of weights stored in the learning weight storage circuit,
wherein the learning weight storage circuit includes:
a plurality of storage circuits, each including a shift register and storing weights being continuous values;
an initialization circuit;
an update control circuit; and
a readout control circuit, wherein
the shift register includes a plurality of cells, each being arranged in series and storing information, the shift register being capable of shifting a position of the cell storing the information among the plurality of cells in a forward direction and a reverse direction in units of cells, a position of each of the plurality of cells corresponding to the weight, the weight corresponding to each of the plurality of cells continuously increasing or decreasing together with a change in the position in the forward direction,
the initialization circuit is configured to, for each of the plurality of storage circuits, write the information to one of the plurality of cells included in the shift register,
the update control circuit is configured to, for each of the plurality of storage circuits,
receive an update amount of the weight, and
shift a position of the cell storing the information in a direction corresponding to a sign of the update amount by a number of cells corresponding to an absolute value of the update amount, and
the readout control circuit is configured to, for each of the plurality of storage circuits,
read out the information stored in the plurality of cells, and
output an output value according to the weight corresponding to the position of the cell storing the information.

* * * * *